(12) United States Patent
Jung et al.

(10) Patent No.: US 12,497,561 B2
(45) Date of Patent: Dec. 16, 2025

(54) INK COMPOSITION, ORGANIC LIGHT-EMITTING DEVICE USING SAME, AND MANUFACTURING METHOD THEREFOR

(71) Applicant: LG Chem, Ltd., Seoul (KR)

(72) Inventors: Ji Young Jung, Daejeon (KR); Mi Kyoung Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 672 days.

(21) Appl. No.: 16/959,839

(22) PCT Filed: Jul. 26, 2019

(86) PCT No.: PCT/KR2019/009323
§ 371 (c)(1),
(2) Date: Jul. 2, 2020

(87) PCT Pub. No.: WO2020/022830
PCT Pub. Date: Jan. 30, 2020

(65) Prior Publication Data
US 2020/0373489 A1    Nov. 26, 2020

(30) Foreign Application Priority Data
Jul. 27, 2018   (KR) .................. 10-2018-0087801

(51) Int. Cl.
*C09D 11/322*    (2014.01)
*C09D 11/36*    (2014.01)
(Continued)

(52) U.S. Cl.
CPC .............. *C09K 11/06* (2013.01); *C09D 11/36* (2013.01); *H10K 71/15* (2023.02); *H10K 85/633* (2023.02);
(Continued)

(58) Field of Classification Search
CPC ............. H01L 51/0038; H01L 51/0039; H01L 51/006; H10K 85/111; H10K 85/115;
(Continued)

(56) References Cited

U.S. PATENT DOCUMENTS

2003/0127977 A1    7/2003   Bae et al.
2008/0280163 A1*  11/2008   Kwong ................. H01L 51/006
                                                           546/10
(Continued)

FOREIGN PATENT DOCUMENTS

CN    100573965 C    12/2009
CN    104144909 A    11/2014
(Continued)

OTHER PUBLICATIONS

KR-20170072595-A—translation (Year: 2017).*
(Continued)

*Primary Examiner* — Jennifer A Boyd
*Assistant Examiner* — Rachel Simbana
(74) *Attorney, Agent, or Firm* — Lerner David LLP

(57) ABSTRACT

The present specification relates to an ink composition including a first solvent represented by Chemical Formula 1 and a compound represented by Chemical Formula 2; an ink composition including a first solvent represented by Chemical Formula 1, a second solvent represented by Chemical Formula 3 or Chemical Formula 4, and a compound represented by Chemical Formula 2; an organic light emitting device including the ink composition and a cured material thereof; and a method for manufacturing the same.

9 Claims, 2 Drawing Sheets

```
601
501
201
101
```

(51) Int. Cl.

| | | |
|---|---|---|
| *C09K 11/06* | (2006.01) | |
| *H10K 50/11* | (2023.01) | |
| *H10K 50/15* | (2023.01) | |
| *H10K 50/17* | (2023.01) | |
| *H10K 71/13* | (2023.01) | |
| *H10K 71/15* | (2023.01) | |
| *H10K 71/30* | (2023.01) | |
| *H10K 85/60* | (2023.01) | |

(52) U.S. Cl.
CPC ............... *C09K 2211/1007* (2013.01); *C09K 2211/1011* (2013.01); *C09K 2211/1014* (2013.01); *H10K 50/11* (2023.02); *H10K 50/15* (2023.02); *H10K 50/17* (2023.02); *H10K 71/135* (2023.02); *H10K 85/626* (2023.02)

(58) Field of Classification Search
CPC ...... H10K 85/10; H10K 85/151; H10K 71/15; H10K 85/633; H10K 85/626; H10K 85/649; C09K 11/06; C09K 2211/1007; C09K 2211/1011; C09K 2211/1014; C09D 11/36
See application file for complete search history.

(56) References Cited

U.S. PATENT DOCUMENTS

| | | | |
|---|---|---|---|
| 2009/0033208 A1 | 2/2009 | Nagayama et al. | |
| 2012/0056169 A1* | 3/2012 | Kaiser | H01L 51/5016 257/E51.024 |
| 2013/0092918 A1 | 4/2013 | Okumoto et al. | |
| 2014/0138655 A1* | 5/2014 | Sonoyama | H01L 51/0007 438/46 |
| 2015/0094437 A1* | 4/2015 | Caille | H01L 51/0072 548/440 |
| 2015/0270485 A1 | 9/2015 | Watanabe | |
| 2016/0155959 A1 | 6/2016 | Kaiser et al. | |
| 2016/0372666 A1 | 12/2016 | Ryu et al. | |
| 2017/0213977 A1 | 7/2017 | Shin et al. | |
| 2017/0335126 A1* | 11/2017 | Watanabe | H10K 85/324 |
| 2018/0226586 A1 | 8/2018 | Parham et al. | |
| 2019/0157580 A1 | 5/2019 | Yoon et al. | |
| 2019/0280206 A1 | 9/2019 | Lee et al. | |

FOREIGN PATENT DOCUMENTS

| | | | | |
|---|---|---|---|---|
| JP | 2003137758 A | * | 5/2003 | |
| KR | 20030058767 A | | 7/2003 | |
| KR | 20090114716 A | | 11/2009 | |
| KR | 20100003632 A | | 1/2010 | |
| KR | 20120096075 A | | 8/2012 | |
| KR | 20140147975 A | | 12/2014 | |
| KR | 20150093995 A | | 8/2015 | |
| KR | 20150110366 A | | 10/2015 | |
| KR | 20150130221 A | | 11/2015 | |
| KR | 20160041124 A | | 4/2016 | |
| KR | 20160053561 A | | 5/2016 | |
| KR | 20160059609 A | | 5/2016 | |
| KR | 20170072595 A | * | 6/2017 | ........... C09D 175/06 |
| KR | 20170089095 A | | 8/2017 | |
| KR | 20170092624 A | | 8/2017 | |
| KR | 101790372 B1 | | 10/2017 | |
| KR | 20170126813 A | | 11/2017 | |
| KR | 20180020522 A | | 2/2018 | |
| KR | 20180022325 A | | 3/2018 | |
| KR | 20180030206 A | | 3/2018 | |
| KR | 20180059379 A | | 6/2018 | |
| TW | 201514185 A | | 4/2015 | |
| WO | 2013040468 A1 | | 3/2013 | |
| WO | 2016072691 A1 | | 5/2016 | |
| WO | 2018001928 A1 | | 1/2018 | |
| WO | WO-2018065357 A1 | * | 4/2018 | ........... C07C 211/61 |

OTHER PUBLICATIONS

JP-2003137758-A—translation (Year: 2003).*
International Search Report for Application No. PCT/KR2019/009323 mailed Oct. 29, 2019, 3 pages.
Search Report dated Jun. 7, 2022 from the Office Action for Chinese Application No. 201980008027.6 issued Jun. 14, 2022, pp. 1-2.

* cited by examiner

[FIG. 1]
| 601 |
|---|
| 501 |
| 201 |
| 101 |
[FIG. 2]
| 601 |
|---|
| 501 |
| 401 |
| 301 |
| 201 |
| 101 |
[FIG. 3]
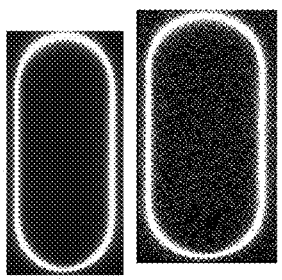

[FIG. 4]
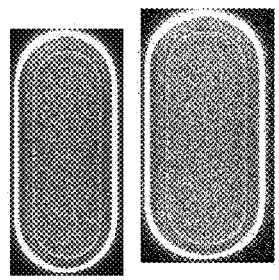
[FIG. 5]
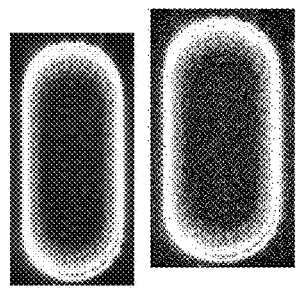
[FIG. 6]
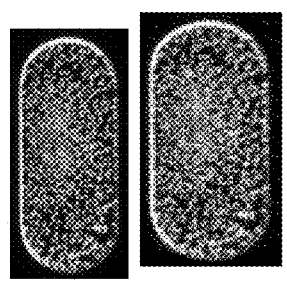
[FIG. 7]
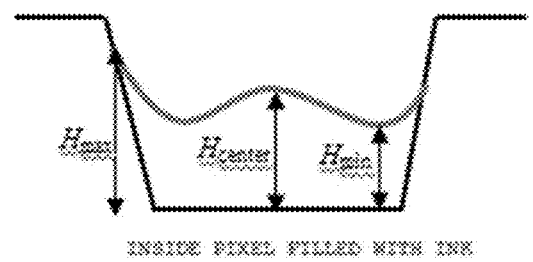
* Flatness = $\dfrac{H_{max} - H_{min}}{H_{center}}$

INK COMPOSITION, ORGANIC LIGHT-EMITTING DEVICE USING SAME, AND MANUFACTURING METHOD THEREFOR

CROSS-REFERENCE TO RELATED APPLICATIONS

This application is a national phase entry under 35 U.S.C. § 371 of International Application No. PCT/KR2019/009323 filed Jul. 26, 2019, which claims priority from Korean Patent Application No. 10-2018-0087801 filed Jul. 27, 2018, all of which are incorporated herein by reference.

TECHNICAL FIELD

The present specification relates to an ink composition, an organic light emitting device formed using the ink composition, and a method for manufacturing the same.

BACKGROUND ART

Solvent selection is most important when using an OLED ink in an inkjet process. There needs to be no nozzle drying so that an ink is stably discharged from the nozzle, and a flat film needs to be formed without precipitation/phase separation of materials when preparing a functional layer film. For this, a solvent having a sufficiently low high boiling point property while having high solubility for OLED materials needs to be included in the ink composition.

A high boiling point (200° C. or higher) benzene-based solvent is normally included in the ink. Including this solvent has an advantage of obtaining a clear film image when forming a functional layer film by having favorable solubility for materials. However, there are disadvantages in that the film has a U shape or a convex (∩) shape, or a film having a non-uniform surface such as asphalt is formed.

A method of adding a glycol-based solvent to a benzene-based solvent is also used in order to increase film flatness. However, a glycol-based solvent generally has low solubility for OLED materials, and when including a benzene-based solvent and a glycol-based solvent in the ink, a disadvantage of sharply declining a film image (precipitation, increase in film roughness) is obtained compared to the effect of improving film flatness.

Therefore, using a solvent capable of increasing film flatness while forming a clear film without precipitation in the ink is important. Accordingly, development of new organic materials has been required in the art.

DISCLOSURE

Technical Problem

The present specification is directed to providing an ink composition, and an organic light emitting device including the same.

Technical Solution

One embodiment of the present specification provides an ink composition including a first solvent represented by the following Chemical Formula 1 and a compound represented by the following Chemical Formula 2.

[Chemical Formula 1]

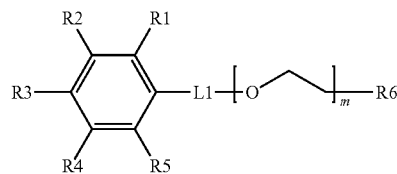

[Chemical Formula 2]

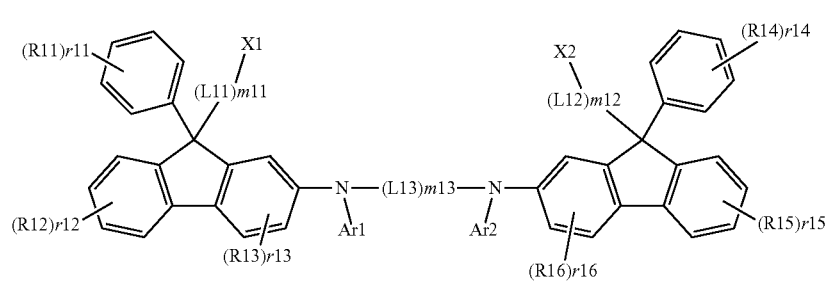

In Chemical Formulae 1 and 2,

R6 is hydrogen, a hydroxyl group, a substituted or unsubstituted alkyl group, or —COR;

R and R1 to R5 are the same as or different from each other, and each independently hydrogen, a hydroxyl group, a substituted or unsubstituted alkoxy group, a substituted or unsubstituted alkyl group, a substituted or unsubstituted ester group, a substituted or unsubstituted carbonyl group, a substituted or unsubstituted aryl group, a substituted or unsubstituted heteroaryl group, a substituted or unsubstituted silyl group, or a substituted or unsubstituted phosphine oxide group, L1 is a direct bond, an alkylene group or an ester group, Ar1 and Ar2 are the same as or different from each other, and each independently hydrogen, or a substituted or unsubstituted aryl group, R11 to R16 are the same as or different from each other, and each independently hydrogen, deuterium, a nitrile group, a hydroxyl group, a halogen group, a substituted or unsubstituted alkyl group, a substituted or unsubstituted aryl group, or a substituted or unsubstituted alkenyl group, X1 and X2 are the same as or different from each other, and each independently a substituted or unsubstituted aryl group, L11 to L13 are the same as or different from each other, and each independently a direct bond, —O—, a substituted or unsubstituted alkylene group, or a substituted or unsubstituted arylene group, m and m11 to m13 are an integer of 1 to 10, r11 and r14 are an integer of 0 to 5, r12 and r15 are an integer of 0 to 4, r13 and r16 are an integer of 0 to 3, when m, m11 to m13, and r11 to r16 are a plural number, substituents in the parentheses are each the same as or different from each other.

Another embodiment of the present specification provides an ink composition including a first solvent represented by the following Chemical Formula 1, a second solvent represented by the following Chemical Formula 3 or Chemical Formula 4, and a compound represented by the following Chemical Formula 2.

R7 to R10 are the same as or different from each other, and each independently a substituted or unsubstituted alkyl group, R11 to R16 are the same as or different from each other, and each independently hydrogen, deuterium, a nitrile group, a hydroxyl group, a halogen group, a substituted or unsubstituted alkyl group, a substituted or unsubstituted aryl group, or a substituted or unsubstituted alkenyl group, X1 and X2 are the same as or different from each other, and each independently a substituted or unsubstituted aryl group, L11 to L13 are the same as or different from each other, and each independently a direct bond, —O—, a substituted or unsubstituted alkylene group, or a substituted or unsubstituted arylene group, m and m11 to m13 are an integer of 1 to 10, r11 and r14 are an integer of 0 to 5, r12 and r15 are an integer of 0 to 4, r13 and r16 are an integer of 0 to 3, when m, m11 to m13, and r11 to r16 are a plural number, substituents in the parentheses are each the same as or different from each other, n is an integer of 1 to 10, and

[Chemical Formula 1]

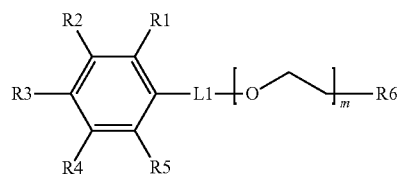

[Chemical Formula 2]

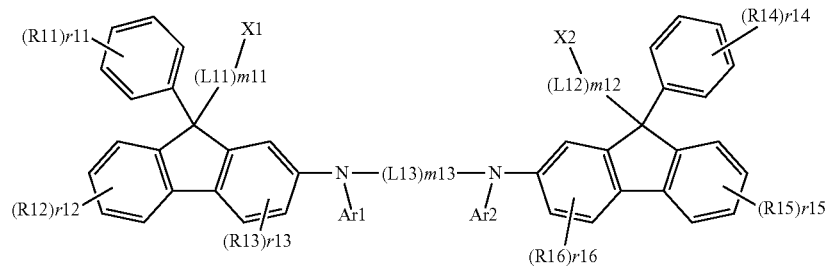

[Chemical Formula 3]

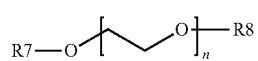

[Chemical Formula 4]

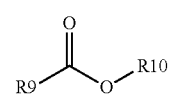

In Chemical Formula 1 to Chemical Formula 4,

L1 is a direct bond, an alkylene group or an ester group,

Ar1 and Ar2 are the same as or different from each other, and each independently hydrogen, or a substituted or unsubstituted aryl group, R6 is hydrogen, a hydroxyl group, a substituted or unsubstituted alkyl group, or —COR, R and R1 to R5 are the same as or different from each other, and each independently hydrogen, a hydroxyl group, a substituted or unsubstituted alkoxy group, a substituted or unsubstituted alkyl group, a substituted or unsubstituted ester group, a substituted or unsubstituted carbonyl group, a substituted or unsubstituted aryl group, a substituted or unsubstituted heteroaryl group, a substituted or unsubstituted silyl group, or a substituted or unsubstituted phosphine oxide group, when n is a plural number, substituents in the parentheses are each the same as or different from each other.

Another embodiment of the present specification provides an organic light emitting device including a first electrode; a second electrode; and one or more organic material layers provided between the first electrode and the second electrode, wherein one or more layers of the organic material layers include the ink composition or a cured material thereof, and the cured material of the ink composition is in a cured state by heat treating or light treating the ink composition.

Lastly, another embodiment of the present specification provides a method for manufacturing an organic light emitting device, the method including preparing a substrate; forming a first electrode on the substrate; forming one or more organic material layers on the first electrode; and forming a second electrode on the organic material layers, wherein the forming of organic material layers includes forming one or more organic material layers using the ink composition or a cured material thereof.

Advantageous Effects

By using a solvent having a specific chemical structural formula in an ink, the present disclosure is capable of securing ink processability, drying property and film flatness at the same time.

DESCRIPTION OF DRAWINGS

FIG. 1 illustrates an example of an organic light emitting device according to one embodiment of the present specification.

FIG. 2 illustrates an example of an organic light emitting device according to one embodiment of the present specification.

FIG. 3 is a diagram of an example in which a film image is clear.

FIG. 4 is a diagram of an example in which a film surface is opaque.

FIG. 5 is a diagram of an example in which a film surface is not uniform.

FIG. 6 is a diagram of an example in which white spots are present due to material aggregation.

FIG. 7 is a diagram on an evaluation of film flatness of a film formed using an ink composition according to one embodiment of the present specification.

REFERENCE NUMERAL

101: Substrate
201: Anode
301: Hole Injection Layer
401: Hole Transfer Layer
501: Light Emitting Layer
601: Cathode

MODE FOR DISCLOSURE

Hereinafter, the present specification will be described in detail.

One embodiment of the present specification provides an ink composition including a first solvent represented by Chemical Formula 1; and a compound represented by Chemical Formula 2.

In order to manufacture a flat OLED functional layer (HIL, HTL, EML) using a solution process, ink processability and film drying property need to be basically secured at the same time. An ink composition is formed mostly with a solvent (minimum 90%, maximum 99.9%), and, since ink properties are determined by the solvent, solvent selection is most important.

The ink processability is a property of an ink being stably discharged from a nozzle of an inkjet apparatus without being dried, and for this, a solvent having a high boiling property with a sufficiently low vapor pressure needs to be selected. The ink film drying property is a property of forming a clear film image without precipitation/phase separation when going through a drying process in an OLED functional layer manufacturing process, and for this, a solvent having a high solubility property capable of sufficiently dissolving OLED materials needs to be selected. (Selecting a solvent having a low solubility property causes problems such as solid aggregation and precipitation after drying). A property required together with the drying property is film flatness. Since the OLED functional layer is formed in a multiply laminated structure, each functional layer needs to be formed flat to exhibit stable light emission properties in a completed OLED device (when the layer is not flat, many problems such as a brightness difference in the pixels, a decrease in the device lifetime, and a device short phenomenon caused by electron transfer leakage occur). Accordingly, selection of a solvent capable of securing ink processability, film drying property and film flatness at the same time is important in an OLED ink composition.

In existing technologies, ink processability and drying property have been secured by including a high boiling point benzene-based solvent in an ink composition, however, there is a disadvantage in that the film surface is not flat. An attempt has been made to form a uniform film using a method of mixing a high boiling point benzene-based solvent and a glycol-based aliphatic ether solvent, however, solubility of the glycol-based solvent for OLED functional layer-forming materials was low frequently causing a problem of declining a film image after drying.

The present disclosure relates to a method capable of securing ink processability, drying property and film flatness at the same time by using a solvent having a specific chemical structural formula in an ink. The core structure of the solvent of Chemical Formula 1 is a benzene structure, and by having a favorable interaction with an aromatic molecular structure of OLED functional materials, solubility for the materials may increase. A side chain of the solvent has a glycol functional group, which leads to advantages of excellent leveling effect and increasing film flatness when drying the film. Accordingly, there is an advantage in that a functional layer that is flat while having a clear film image without precipitation is obtained using just a single solvent. In addition, the solvent of the present structural formula has high solubility (10 wt % or higher) for OLED functional layer-forming materials, a functional layer that is flat while having a clear film image is obtained even when a glycol-based solvent having relatively poor solubility is added as a second solvent (role of increasing film flatness).

Ink film flatness is determined depending on the type of the solvent included in the ink composition, and since having favorable flatness is advantageous in laying a next laminated layer flat, a device having high efficiency may be manufactured.

In the present specification, a description of one member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

Hereinafter, substituents of the present specification will be described in detail.

In the present specification, the term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the term "a substituted or unsubstituted" means being substituted with one or more substituents selected from the group consisting of deuterium; a halogen group; a nitrile group; a silyl group; an alkyl group; an alkenyl group; an ester group; an alkoxy group; an aryl group; and a heterocyclic group, or being unsubstituted, or being substituted with a substituent linking two or more substituents among the substituents illustrated above, or being unsubstituted. For example, "a substituent linking two or more substituents" may include a biphenyl group. In other words, a biphenyl group may be an aryl group, or interpreted as a substituent linking two phenyl groups.

In the present specification, the halogen group may include fluorine (F), chlorine (Cl), bromine (Br) or iodine (I).

In the present specification, the silyl group may be represented by a chemical formula of —SiRaRbRc, and Ra, Rb and Rc may each be hydrogen; a substituted or unsubstituted alkyl group; or a substituted or unsubstituted aryl group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the alkyl group may be linear or branched, and although not particularly limited thereto, the number of carbon atoms may be from 1 to 60. According to one embodiment, the number of carbon atoms of the alkyl group may be from 1 to 30. According to another embodiment, the number of carbon atoms of the alkyl group is from 1 to 10. Specific examples of the alkyl group may include a methyl group, an ethyl group, a propyl group, an isopropyl group, an n-butyl group, an isobutyl group, a tert-butyl group, an n-pentyl group, an n-hexyl group, an n-heptyl group and the like, but are not limited thereto.

In the present specification, the alkoxy group may be linear, branched or cyclic. Although not particularly limited thereto, the number of carbon atoms of the alkoxy group may be from 1 to 20. Specific examples of the alkoxy group may include a methoxy group, an ethoxy group, an n-propoxy group, an n-butoxy group, a tert-butoxy group, an n-pentyloxy group, an n-hexyloxy group, an n-octyloxy group, an n-nonyloxy group, an n-decyloxy group and the like, but are not limited thereto.

In the present specification, the alkoxy group may be linear, branched or cyclic. Although not particularly limited thereto, the number of carbon atoms of the alkoxy group may be from 1 to 20. Specific examples of the alkoxy group may include a methoxy group, an ethoxy group, an n-propoxy group, an isopropoxy group, an i-propyloxy group, an n-butoxy group, an isobutoxy group, a tert-butoxy group, a sec-butoxy group, an n-pentyloxy group, a neopentyloxy group, an isopentyloxy group, an n-hexyloxy group, a 3,3-dimethylbutyloxy group, a 2-ethylbutyloxy group, an n-octyloxy group, an n-nonyloxy group, an n-decyloxy group, a benzyloxy group, a p-methylbenzyloxy group and the like, but are not limited thereto.

In the present specification, the aryl group is not particularly limited, but may have 6 to 60 carbon atoms, and may be a monocyclic aryl group or a polycyclic aryl group. According to one embodiment, the number of carbon atoms of the aryl group is from 6 to 30. According to one embodiment, the number of carbon atoms of the aryl group is from 6 to 20. Examples of the monocyclic aryl group may include a phenyl group, a biphenyl group, a terphenyl group and the like, but are not limited thereto. Examples of the polycyclic aryl group may include a naphthyl group, an anthracenyl group, a phenanthrenyl group, a pyrenyl group, a perylenyl group, a triphenyl group, a chrysenyl group, a fluorenyl group and the like, but are not limited thereto.

In the present specification, the heterocyclic group is a heterocyclic group including one or more of N, O, P, S, Si and Se as a heteroatom, and although not particularly limited thereto, the number of carbon atoms may be from 2 to 60. According to one embodiment, the number of carbon atoms of the heterocyclic group is from 2 to 30. According to another embodiment, the number of carbon atoms of the heterocyclic group is from 2 to 20. Examples of the heterocyclic group may include a pyridyl group, a pyrrole group, a pyrimidyl group, a pyridazinyl group, a furanyl group, a thiophene group, a benzothiophene group, a benzofuran group, a dibenzothiophene group, a dibenzofuran group and the like, but are not limited thereto.

In the present specification, descriptions on the heterocyclic group provided above may be applied to the heteroaryl group except for being aromatic.

In the present specification, descriptions on the aryl group provided above may be applied to the arylene group except for being divalent.

In one embodiment of the present specification, Chemical Formula 1 may be represented by the following Chemical Formula 1-1 or 1-2.

[Chemical Formula 1-1]

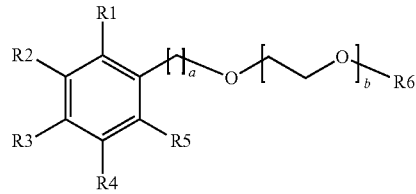

[Chemical Formula 1-2]

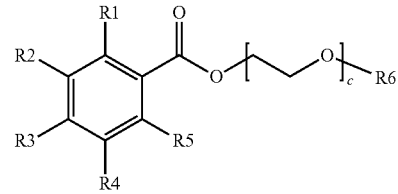

In Chemical Formulae 1-1 and 1-2,
R1 to R6 have the same definitions as in Chemical Formula 1,
a is an integer of 0 to 10, and
b and c are each independently an integer of 1 to 10.

In one embodiment of the present specification, R1 to R5 are the same as or different from each other, and each independently hydrogen, a hydroxyl group, an alkoxy group, an alkyl group, an ester group, an aryl group, a heteroaryl group, a silyl group or a phosphine oxide group.

In one embodiment of the present specification, R1 to R5 are hydrogen.

In one embodiment of the present specification, R6 is hydrogen, a hydroxyl group, a substituted or unsubstituted alkyl group, or —COR.

In one embodiment of the present specification, R6 is hydrogen, a hydroxyl group, an alkyl group having 1 to 10 carbon atoms, or —COR, and R is an alkyl group having 1 to 10 carbon atoms.

In one embodiment of the present specification, R6 is hydrogen, a hydroxyl group, a methyl group, an ethyl group, a propyl group, an isopropyl group, a butyl group, a tert-butyl group, a pentyl group, a hexyl group, or —COR, and R is a methyl group, an ethyl group, a propyl group, an isopropyl group, a butyl group, a tert-butyl group, a pentyl group or a hexyl group.

In one embodiment of the present specification, R7 to R10 are the same as or different from each other, and each independently a substituted or unsubstituted alkyl group having 1 to 10 carbon atoms.

In one embodiment of the present specification, R7 to R10 are the same as or different from each other, and each independently a methyl group, an ethyl group, a propyl group, an isopropyl group, a butyl group, a tert-butyl group, a linear or branched pentyl group, a linear or branched hexyl group, a linear or branched heptyl group, a linear or branched octyl group, a linear or branched nonyl group, or a linear or branched decyl group.

In one embodiment of the present specification, R11 to R16 are the same as or different from each other, and each independently hydrogen, deuterium, a nitrile group, a hydroxyl group, a halogen group, an alkyl group, an aryl group or an alkenyl group.

In one embodiment of the present specification, R11 to R16 are the same as or different from each other, and each independently hydrogen, deuterium, a nitrile group, a hydroxyl group, a halogen group, an alkyl group having 1 to 10 carbon atoms, an aryl group having 6 to 30 carbon atoms, or an alkenyl group having 2 to 10 carbon atoms.

In one embodiment of the present specification, R11 to R16 are the same as or different from each other, and each independently hydrogen, deuterium, a nitrile group, a hydroxyl group, F, Cl, Br, I, a methyl group, an ethyl group, a propyl group, an isopropyl group, a butyl group, a tert-butyl group, a linear or branched pentyl group, a linear or branched hexyl group, a linear or branched heptyl group, a linear or branched octyl group, a linear or branched nonyl group, a linear or branched decyl group, a phenyl group, a biphenyl group, a terphenyl group, a naphthyl group, an anthracene group, a phenanthrene group, a pyrene group, a triphenylene group, an ethenyl group, a 2-propenyl group, a 2-butenyl group or a 3-butenyl group.

In one embodiment of the present specification, R11 to R16 are the same as or different from each other, and each independently hydrogen, an ethenyl group or a methyl group.

In one embodiment of the present specification, L1 is a direct bond, an alkylene group or an ester group.

In one embodiment of the present specification, L1 is a direct bond, an alkylene group having 1 to 10 carbon atoms, or an ester group.

In one embodiment of the present specification, Ar1 and Ar2 are the same as or different from each other, and each independently hydrogen, or a substituted or unsubstituted aryl group.

In one embodiment of the present specification, Ar1 and Ar2 are the same as or different from each other, and each independently hydrogen or an aryl group.

In one embodiment of the present specification, Ar1 and Ar2 are the same as or different from each other, and each independently hydrogen, or an aryl group having 6 to 30 carbon atoms.

In one embodiment of the present specification, Ar1 and Ar2 are the same as or different from each other, and each independently hydrogen, a monocyclic aryl group having 6 to 30 carbon atoms, or a polycyclic aryl group having 6 to 30 carbon atoms.

In one embodiment of the present specification, Ar1 and Ar2 are the same as or different from each other, and each independently hydrogen, a phenyl group, a biphenyl group or a naphthyl group.

In one embodiment of the present specification, X1 and X2 are the same as or different from each other, and each independently a substituted or unsubstituted aryl group.

In one embodiment of the present specification, X1 and X2 are the same as or different from each other, and each independently a substituted or unsubstituted aryl group having 6 to 30 carbon atoms.

In one embodiment of the present specification, X1 and X2 are the same as or different from each other, and each independently an aryl group having 6 to 30 carbon atoms, and
    the aryl group is unsubstituted or substituted with deuterium, a nitrile group, a halogen group, an alkyl group, an aryl group, an alkoxy group, an alkenyl group or a heteroaryl group.

In one embodiment of the present specification, X1 and X2 are the same as or different from each other, and each independently a phenyl group, a biphenyl group, a terphenyl group, a naphthyl group, an anthracene group, a phenanthrene group, a triphenylene group or a fluorene group, and
    the phenyl group, the biphenyl group, the terphenyl group, the naphthyl group, the anthracene group, the phenanthrene group, the triphenylene group or the fluorene group is unsubstituted or substituted with deuterium, a nitrile group, a halogen group, an alkyl group, an aryl group, an alkoxy group, an alkenyl group or a heteroaryl group.

In one embodiment of the present specification, X1 and X2 are the same as or different from each other, and each independently a phenyl group, a biphenyl group, a terphenyl group, a naphthyl group, an anthracene group, a phenanthrene group, a triphenylene group or a fluorene group, and
    the phenyl group, the biphenyl group, the terphenyl group, the naphthyl group, the anthracene group, the phenanthrene group, the triphenylene group or the fluorene group is unsubstituted or substituted with deuterium, a nitrile group, a halogen group, a methyl group, an ethyl group, a propyl group, an isopropyl group, a butyl group, a tert-butyl group, a pentyl group, an isopentyl group, a phenyl group, a naphthyl group, an anthracene group, a methoxy group, an ethoxy group, a propoxy group, a butoxy group, a tert-butoxy group, an ethenyl group, a 2-propenyl group, a 2-butenyl group or a 3-butenyl group.

In one embodiment of the present specification, X1 and X2 are the same as or different from each other, and each independently a phenyl group unsubstituted or substituted with an ethenyl group.

In one embodiment of the present specification, L11 to L13 are the same as or different from each other, and each independently a direct bond, a substituted or unsubstituted alkylene group, or a substituted or unsubstituted arylene group.

In one embodiment of the present specification, L11 to L13 are the same as or different from each other, and each independently a direct bond, an alkylene group having 1 to 10 carbon atoms, or an arylene group having 6 to 30 carbon atoms.

In one embodiment of the present specification, L11 to L13 are the same as or different from each other, and each independently a direct bond, or an alkylene group having 1 to 10 carbon atoms.

In one embodiment of the present specification, -(L11)m11-X1 and -(L12)m12-X2 are the same as or different from each other, and are each any one selected from among the following substituents.

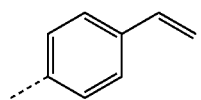

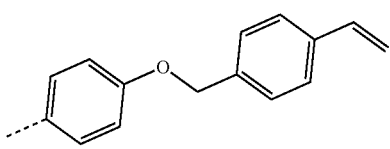

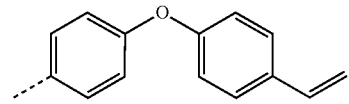

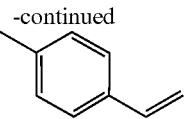

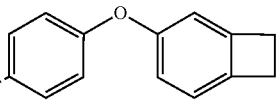

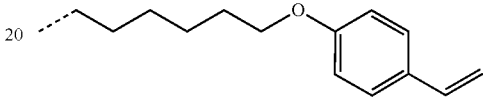

In one embodiment of the present specification, the compound of Chemical Formula 1 is any one of 2-phenoxyethanol, 2-(benzyloxy) ethanol, 3-(4-hydroxyethoxy)toluene, 4-(2-hydroxyethoxy)toluene, methyl 4-(2-hydroxyethoxy) benzoate, 2-phenoxyethyl acetate, 4-(2-acetoxyethoxy)toluene, 2-phenoxyethyl isobutyrate, 2-ethoxyethyl benzoate, 2-isopropoxyethyl benzoate, diethylene glycol monophenyl ether and diethylene glycol monobenzyl ether.

In one embodiment of the present specification, the compound of Chemical Formula 2 is any one of the following structures.

Compound 1

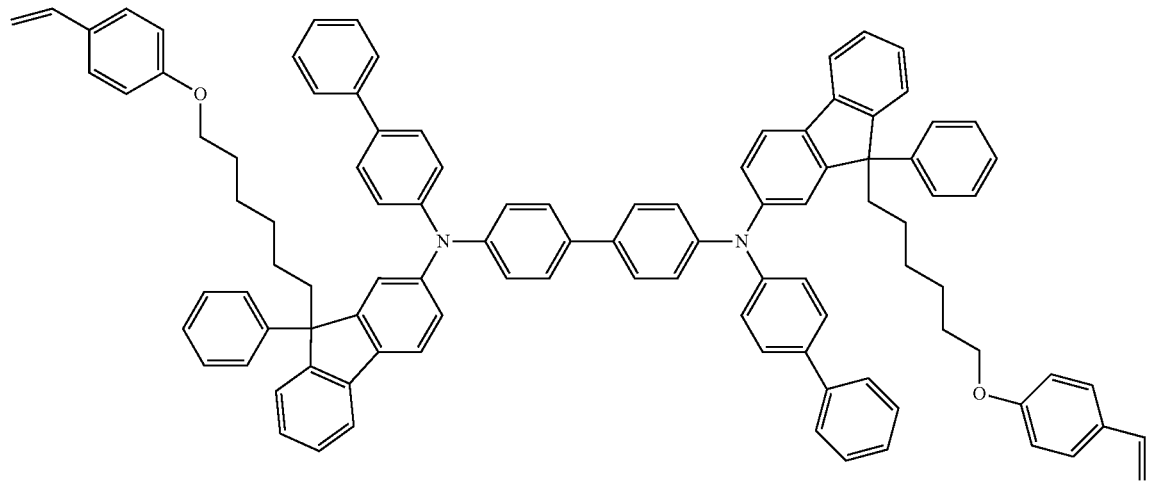

-continued
Compound 2
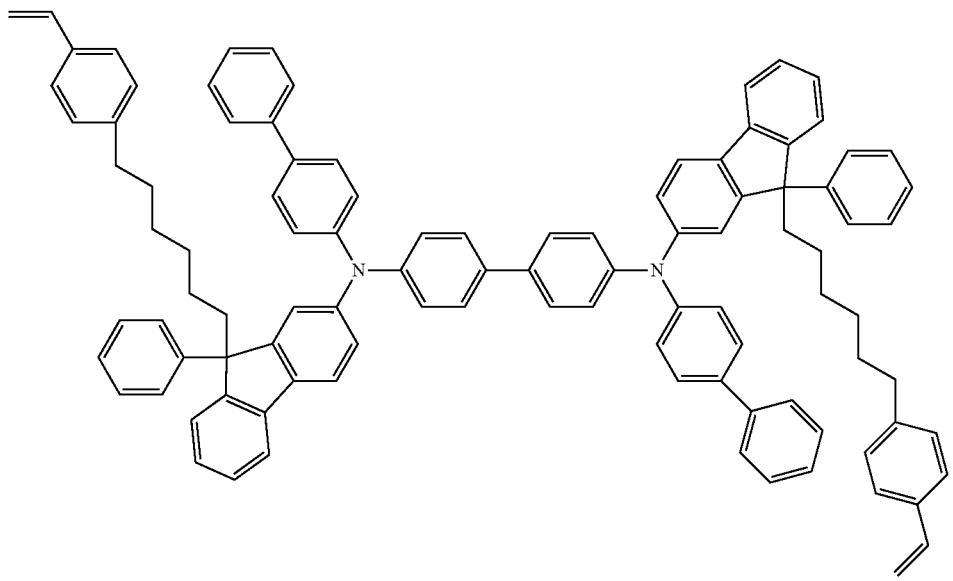
Compound 3
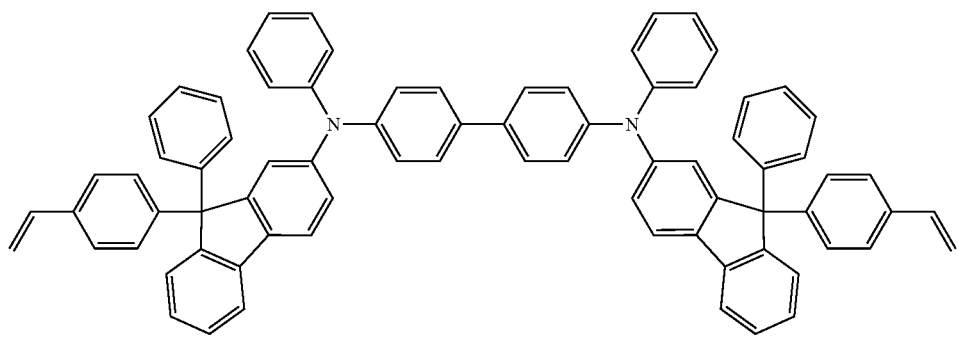
Compound 4
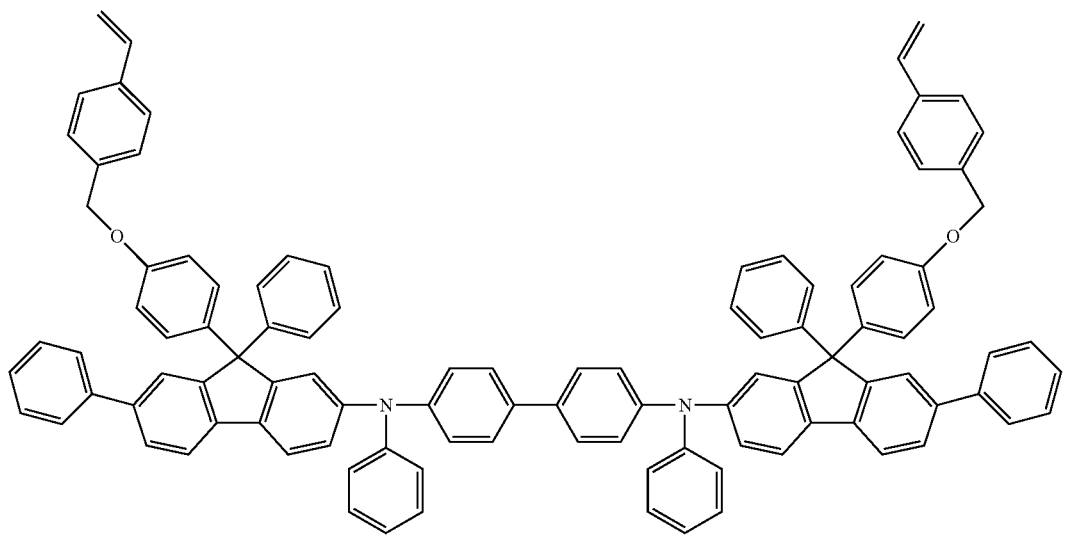

Compound 5

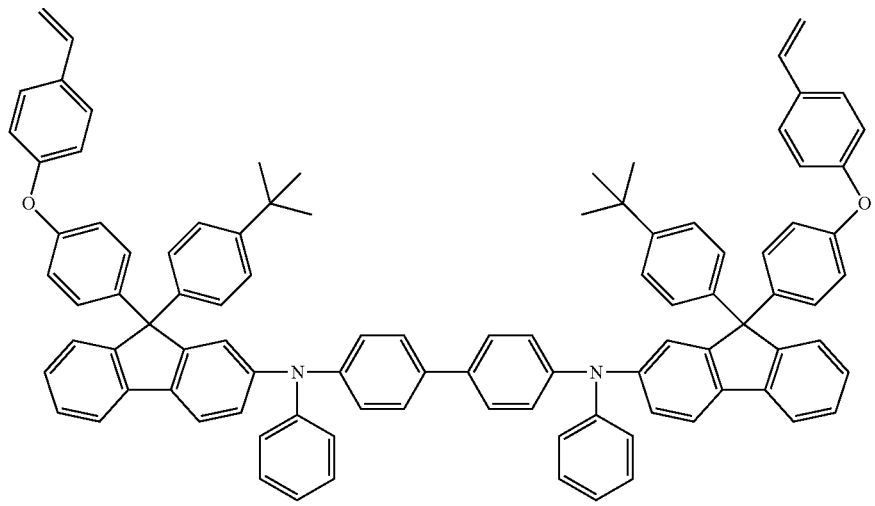

Compound 6

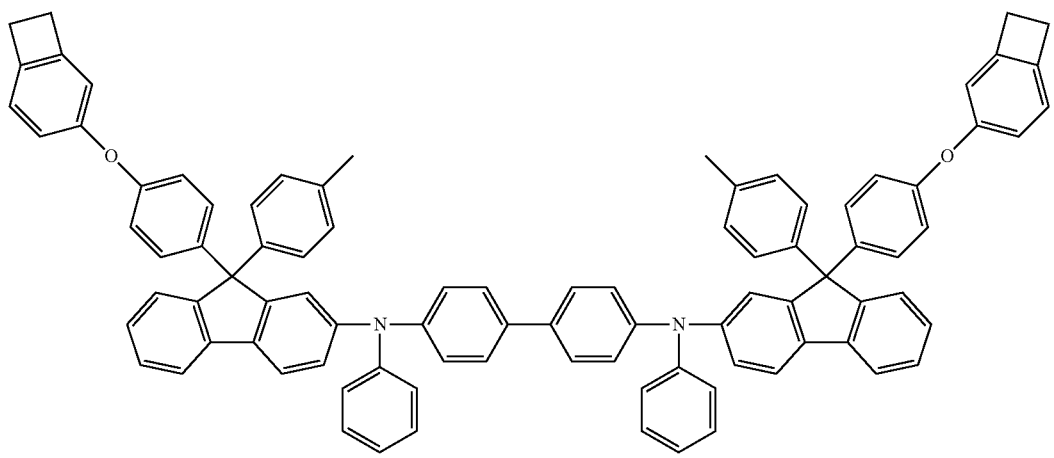

In one embodiment of the present specification, the second solvent of Chemical Formula 3 and Chemical Formula 4 is any one of diethylene glycol butyl methyl ether, diethylene glycol dibutyl ether, tetraethylene glycol dimethyl ether, triethylene glycol butyl methyl ether, ethyl n-octanoate, isopropyl n-octanoate, isoamyl n-octanoate, amyl n-octanoate and methyl laurate.

In one embodiment of the present disclosure, the ink composition may further include a p-doping material. The p-doping material performs a role of allowing the compound of Chemical Formula 2 to have a p-semiconductor property. The p-semiconductor property means a property receiving or transferring holes to a highest occupied molecular orbital (HOMO) energy level, that is, a property of a material having high hole conductivity.

In one embodiment of the present disclosure, the p-doping material may be represented by one of the following Chemical Formulae A to F, but is not limited thereto.

Chemical Formula A

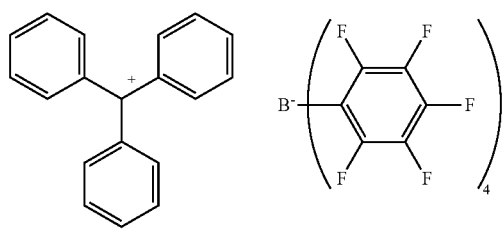

Chemical Formula B

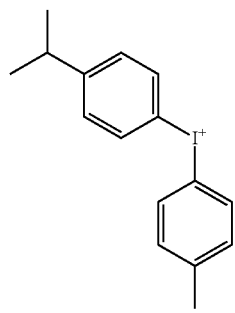
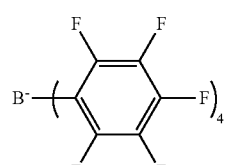

Chemical Formula C

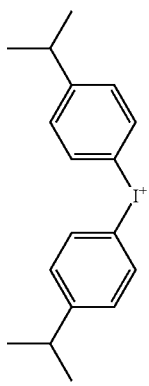
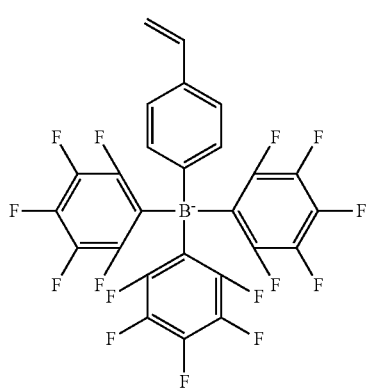

Chemical Formula D

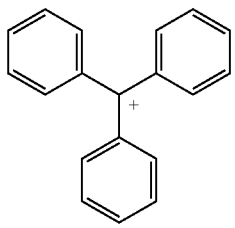

Chemical Formula E

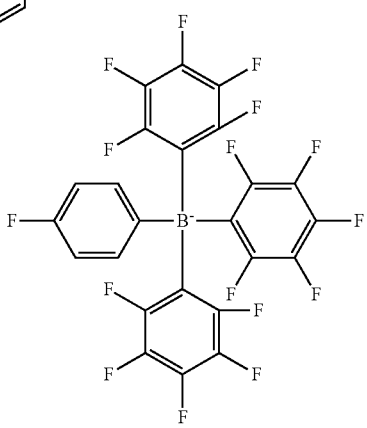

Chemical Formula F

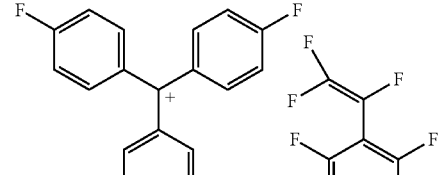
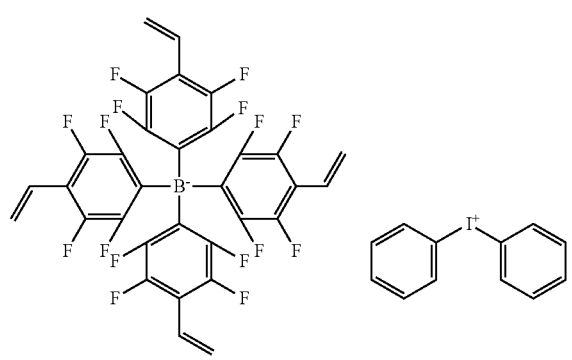

In one embodiment of the present specification, the ink composition contains the second solvent of Chemical Formula 3 or 4 in 10% by mass to 90% by mass or less with respect to the whole ink composition.

In one embodiment of the present specification, the ink composition includes the first solvent in 0.01% by mass to 90% by mass based on the mass of the whole solvent.

In one embodiment of the present specification, the ink composition includes the first solvent in 0.1% by mass to 80% by mass based on the mass of the whole solvent.

In one embodiment of the present specification, the ink composition includes the second solvent in 10% by mass to 99.99% by mass based on the mass of the whole solvent.

In one embodiment of the present specification, the ink composition includes the second solvent in 20% by mass to 99.9% by mass based on the mass of the whole solvent.

In one embodiment of the present specification, an organic light emitting device formed using the ink composition or a cured material thereof includes a first electrode; a second electrode; and one or more organic material layers provided between the first electrode and the second electrode, wherein one or more layers of the organic material layers include the ink composition or a cured material thereof, and the cured material of the ink composition is in a cured state by heat treating or light treating the coating composition.

In one embodiment of the present specification, the organic material layer includes a hole injection layer, a hole transfer layer, or a hole injection and transfer layer, and the hole injection layer, the hole transfer layer, or the hole injection and transfer layer includes the ink composition or a cured material thereof.

In one embodiment of the present specification, the organic material layer includes an electron injection layer, an electron transfer layer, or an electron injection and transfer layer, and the electron injection layer, the electron transfer layer, or the electron injection and transfer layer includes the ink composition or a cured material thereof.

In one embodiment of the present specification, the organic material layer includes a light emitting layer, and the light emitting layer includes the ink composition or a cured material thereof.

In the case of an ink composition having a different compound but having the same solvent composition, there is a difference in performance such as efficiency and lifetime when manufacturing a device. In the case of an ink composition having a different solvent composition but having the same compound, a difference may be identified in the film image and the like.

In one embodiment of the present specification, the first electrode is an anode, and the second electrode is a cathode.

According to another embodiment, the first electrode is a cathode, and the second electrode is an anode.

In another embodiment, the organic light emitting device may be an organic light emitting device having a structure in which an anode, one or more organic material layers and a cathode are consecutively laminated on a substrate (normal type).

In another embodiment, the organic light emitting device may be an organic light emitting device having a structure in a reverse direction in which a cathode, one or more organic material layers and an anode are consecutively laminated on a substrate (inverted type).

FIG. 1 illustrates a structure of the organic light emitting device in which an anode (201), a light emitting layer (501) and a cathode (601) are consecutively laminated on a substrate (101).

FIG. 2 illustrates a structure of the organic light emitting device in which an anode (201), a hole injection layer (301), a hole transfer layer (401), a light emitting layer (501) and a cathode (601) are consecutively laminated on a substrate (101).

FIG. 1 illustrates the organic light emitting device, however, the organic light emitting device is not limited thereto.

When the organic light emitting device includes a plurality of organic material layers, the organic material layers may be formed with materials that are the same as or different from each other.

The organic light emitting device of the present specification may be manufactured using materials and methods known in the art, except that one or more layers of the organic material layers are formed using the ink composition.

Another embodiment of the present specification provides a method for manufacturing an organic light emitting device formed using the ink composition.

Specifically, in one embodiment of the present specification, the method for manufacturing an organic light emitting device formed using the ink composition includes preparing a substrate; forming a first electrode on the substrate; forming one or more organic material layers on the first electrode; and forming a second electrode on the organic material layers, wherein the forming of organic material layers includes forming one or more organic material layers using the ink composition.

In another embodiment, the forming of one or more organic material layers using the ink composition uses inkjet printing.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having small work function are normally preferred so that electron injection to an organic material layer is smooth. Specific examples of the cathode material include metals such as barium, magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxyquinoline aluminum complexes ($Alq_3$); carbazole-based compounds; dimerized styryl compounds; BAlq; 10-hydroxybenzo quinoline-metal compounds; benzoxazole-, benzthiazole- and benzimidazole-based compounds; poly(p-phenylenevinylene) (PPV)-based polymers; spiro compounds; polyfluorene, rubrene, and the like, but are not limited thereto.

The light emitting layer may include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, however, the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and includes arylamino group-including pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, however, the styrylamine compound is not limited thereto. In addition, the metal complex includes iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited there.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, however, the material is not limited thereto.

The organic light emitting device according to the present specification may be a top-emission type, a bottom-emission type or a dual-emission type depending on the materials used.

The ink composition according to one embodiment of the present specification may be prepared using a preparation method to describe below.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art 다.

Experimental Method

1. With respect to 100 parts by weight of a solvent, a functional material (Compounds 1 to 6) were dissolved in 2.0 parts by weight to prepare an ink composition.
2. Inside an OLED pixel was filled with the ink using an inkjet printing method, and then the result was vacuum dried for 10 minutes to 60 minutes using a vacuum drying apparatus, and then heat dried for 10 minutes to 60 minutes on a hot plate to prepare a film.

In the experimental method, a solvent manufactured by TCI Co., Ltd. was used as the solvent, and Compounds 1 to 6 were prepared through the preparation example of Korean Patent Application No. 10-2017-0124472.

For the ink film prepared using the experimental method, the following four items such as solubility, discharge stability, an image of the formed film and film flatness were evaluated.

<Evaluation Item>

1) Evaluation of Ink Stability

The prepared functional ink was stored in a closed cartridge for a month under a 25° C., atmospheric pressure and air condition, and a state of the ink visually identified was evaluated according to the following criteria.

O: very stable solution state

X: solid precipitated, phase separated, cloudy solution state

2) Evaluation of Discharge Stability 10 pL of liquid droplets were discharged using an inkjet apparatus, and the discharged image visually observed through the apparatus camera was evaluated according to the following criteria.

The liquid droplets were stably discharged for 20 minutes or longer without swaying: O The liquid droplets were swaying a little or straightness was a little inferior: Δ

The liquid droplets were not discharged: X

3) Evaluation of Film Image

The ink was printed on a substrate, then dried, and whether the film was well-formed was observed through an optical microscope, and the film image was evaluated according to the following criteria.

The film image was clear: O

The film surface was opaque, and roughness was severe, or material precipitation/phase separation, white spots (material aggregation) were observed: X FIG. 3 is a diagram of an example in which the film image was clear.

FIG. 4 is a diagram of an example in which the film surface was opaque.

FIG. 5 is a diagram of an example in which the film surface was not uniform.

FIG. 6 is a diagram of an example in which white spots were present due to material aggregation.

4) Evaluation of Film Flatness

The film surface shape was analyzed using an optical profiler (OP) in order to observe whether the film surface was formed flat, and the film flatness was evaluated according to the following criteria.

$$\text{Flatness} = \frac{H_{max} - H_{min}}{H_{center}}$$

Less than 0.3: O
Greater than or equal to 0.3 and less than 0.5: Δ
0.5 or greater: X FIG. 7 is a diagram on the evaluation of film flatness of the film formed using the ink composition according to one embodiment of the present specification.

The following Table 1 relates to a solvent used in examples.

TABLE 1

| | Solvent Type | Name of Solvent | Boiling Point |
|---|---|---|---|
| Example | First Solvent | 2-Phenoxyethyl Isobutyrate | 273 |
| | | 4-(2-Acetoxyethoxy)toluene | 266 |
| | | 2-Ethoxyethyl Benzoate | 261 |
| | | 2-Isopropoxyethyl Benzoate | 257 |
| | | 2-(Benzyloxy)ethanol | 256 |
| | | 2-Phenoxyethanol | 237 |
| | | 2-Phenoxyethyl Acetate | 231 |

TABLE 1-continued

| Solvent Type | Name of Solvent | Boiling Point |
|---|---|---|
| Second Solvent | Diethylene Glycol Butyl Methyl Ether | 212 |
| | Diethylene Glycol Dibutyl Ether | 256 |
| | Isoamyl n-Octanoate | 268 |

The following Table 2 relates to a solvent used in comparative examples.

TABLE 2

| | Solvent Type | Name of Solvent | Boiling Point |
|---|---|---|---|
| Comparative Example | Benzene-based (Ether Group, Ester Group) | 3-Phenoxytoluene | 265 |
| | | Dimethyl Phthalate | 282 |
| | Aliphatic-based (Ether Group, Ester Group) | Diethylene Glycol Butyl Methyl Ether | 212 |
| | | Diethylene Glycol Dibutyl Ether | 256 |
| | | Isoamyl n-Octanoate | 268 |
| | Mixed Solvent of Benzene-based + Aliphatic-based | Phenoxytoluene + Diethylene Glycol Dibutyl Ether | 261 + 256 |
| | | Dimethyl Phthalate + Diethylene Glycol Dibutyl Ether | 282 + 256 |

Comparative Example

In the experimental method, p-doping materials C to E were each mixed (weight ratio of 8:2) to the functional material according to the following Table 3 to proceed Comparative Examples 1 to 7. Information on the functional materials and the solvents used in the experiments, and experimental results are described in the following Table 3.

TABLE 3

| | Functional Layer Material (2 wt %, Mixing Ratio: 8:2) | | | Evaluation of Ink Stability | Evaluation of Discharge Stability | Evaluation of Ink Film Image | Evaluation of Ink Film Flatness |
|---|---|---|---|---|---|---|---|
| | Compound | P-Doping Material | Solvent (Content: 98 wt %) | | | | |
| Comparative Example 1 | 3 | C | 2-Phenoxytoluene | x | o | Δ | x |
| Comparative Example 2 | | | Dimethyl Phthalate | o | Δ | o | x |
| Comparative Example 3 | | D | Diethylene Glycol Dibutyl Ether | o | o | x | o |
| Comparative Example 4 | | | Diethylene Glycol Butyl Methyl Ether | o | o | x | o |
| Comparative Example 5 | | | Isoamyl n-Octanoate | x | Δ | x | o |
| Comparative Example 6 | | E | 3-Phenoxytoluene + Diethylene Glycol Dibutyl Ether (Weight Ratio of 8:2) | o | o | x | o |
| Comparative Example 7 | | | Dimethyl Phthalate + Diethylene Glycol Dibutyl Ether (Weight Ratio of 8:2) | o | o | x | Δ |

Comparative Example 1 relates to an ink dissolved in a benzene-based solvent having an ether functional group, and Comparative Example 2 relates to an ink dissolved in a benzene-based solvent having an ester functional group.

In Comparative Example 1, the ink stability evaluation, the ink film image and the flatness were Δ or X. This is considered to be due to decreased dispersibility for the materials. It was seen that the solvent was favorably wetted on the bank wall due to the nature of the solvent and the ink film formed a U-shape during the drying process causing a decrease in the flatness.

In Comparative Example 2, the ink film image was O since the dimethyl phthalate solvent had favorable solubility for the materials, however, the film flatness was X. This is considered to be due to the fact that the solvent was favorably wetted on the bank wall due to the nature of the solvent and the ink film formed a U-shape during the drying process.

Comparative Examples 3 to 5 relate to adding an aliphatic solvent having an ether or ester functional group, and the film images were all X in the evaluation. This is considered to be due to low solubility for the materials. In the process of drying the ink in the experiment, the ink goes through vacuum drying, and concentrations of the materials in the solvent increase over time, and when the solvent is not able to sufficiently dissolve/disperse the materials, the materials aggregate each other or are precipitated.

Comparative Examples 6 and 7 relate to adding an aliphatic solvent to an aromatic solvent. An aromatic solvent has a favorable ink film image but has decreased film flatness, and an aliphatic solvent has favorable ink film flatness but has a poor ink film image. Accordingly, two types of solvents were mixed to improved flatness while having a favorable film image. However, the film image was X in the evaluation whereas the film flatness was somewhat improved.

From the results of Comparative Examples 1 to 7, it was seen that using an aromatic solvent or an aliphatic solvent having an ether or ester functional group either as a single solvent or as a mixture has a limit in satisfying all of solubility, discharge stability, image of the formed film, film flatness and the like.

Example

In the experimental method, p-doping materials C to E were each mixed to Compounds 1 to 6 according to the following Tables 4 to 9, respectively, to proceed Examples 1-1 to 6-28. Information on the functional materials and the solvents used in the experiments, and experimental results are each described in the following Tables 4 to 9.

TABLE 4

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 1-1 | 1 | C | 2-Phenoxyethyl Isobutyrate | — | o | o | o | o |
| Example 1-2 | | | 4-(2-Acetoxyethoxy)toluene | | o | o | o | o |
| Example 1-3 | | | 2-Ethoxyethyl Benzoate | | o | o | o | o |
| Example 1-4 | | | 2-Isopropoxyethyl Benzoate | | o | o | o | o |
| Example 1-5 | | | 2-(Benzyloxy)ethanol | | o | o | o | Δ |
| Example 1-6 | | | 2-Phenoxyethanol | | o | Δ | o | Δ |
| Example 1-7 | | | 2-Phenoxyethyl Acetate | | o | Δ | o | Δ |
| Example 1-8 | 1 | D | 2-Phenoxyethyl Isobutyrate | Diethylene Glycol | o/o/o/o | o/o/o/o | o/o/o/o | o/o/o/o |
| Example 1-9 | | | 4-(2-Acetoxyethoxy)toluene | Butyl Methyl Ether | o/o/o/o | o/o/o/o | o/o/o/o | o/o/o/o |
| Example 1-10 | | | 2-Ethoxyethyl Benzoate | | o/o/o/o | o/o/o/o | o/o/o/o | o/o/o/o |
| Example 1-11 | | | 2-Isopropoxyethyl Benzoate | | o/o/o/o | o/o/o/o | o/o/o/o | o/o/o/o |
| Example 1-12 | | | 2-(Benzyloxy)ethanol | | o/o/o/o | o/o/o/o | o/o/o/o | Δ/o/o/o |
| Example 1-13 | | | 2-Phenoxyethanol | | o/o/o/o | Δ/Δ/Δ/Δ | o/o/o/o | Δ/o/o/o |
| Example 1-14 | | | 2-Phenoxyethyl Acetate | | o/o/o/o | Δ/Δ/Δ/Δ | o/o/o/o | Δ/o/o/o |
| Example 1-15 | 1 | E | 2-Phenoxyethyl Isobutyrate | Diethylene Glycol | o/o/o/o | o/o/o/o | o/o/o/o | o/o/o/o |
| Example 1-16 | | | 4-(2-Acetoxyethoxy)toluene | Dibutyl Ether | o/o/o/o | o/o/o/o | o/o/o/o | o/o/o/o |
| Example 1-17 | | | 2-Ethoxyethyl Benzoate | | o/o/o/o | o/o/o/o | o/o/o/o | o/o/o/o |
| Example 1-18 | | | 2-Isopropoxyethyl Benzoate | | o/o/o/o | o/o/o/o | o/o/o/o | o/o/o/o |

TABLE 4-continued

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 1-19 | | | 2-(Benzyloxy)ethanol | | ○/○/○/○ | ○/○/○/○ | ○/○/○/○ | Δ/○/○/○ |
| Example 1-20 | | | 2-Phenoxyethanol | | ○/○/○/○ | ○/○/○/○ | ○/○/○/○ | Δ/○/○/○ |
| Example 1-21 | | | 2-Phenoxyethyl Acetate | | ○/○/○/○ | ○/○/○/○ | ○/○/○/○ | Δ/○/○/○ |
| Example 1-22 | 1 | E | 2-Phenoxyethyl Isobutyrate | Isoamyl n-Octanoate | ○/○/○/○ | ○/○/○/○ | ○/○/○/○ | ○/○/○/○ |
| Example 1-23 | | | 4-(2-Acetoxyethoxy)toluene | | ○/○/○/○ | ○/○/○/○ | ○/○/○/○ | ○/○/○/○ |
| Example 1-24 | | | 2-Ethoxyethyl Benzoate | | ○/○/○/○ | ○/○/○/○ | ○/○/○/○ | ○/○/○/○ |
| Example 1-25 | | | 2-Isopropoxyethy Benzoate | | ○/○/○/○ | ○/○/○/○ | ○/○/○/○ | ○/○/○/○ |
| Example 1-26 | | | 2-(Benzyloxy)ethanol | | ○/○/○/○ | ○/○/○/○ | ○/○/○/○ | Δ/○/○/○ |
| Example 1-27 | | | 2-Phenoxyethanol | | ○/○/○/○ | ○/○/○/○ | ○/○/○/○ | Δ/○/○/○ |
| Example 1-28 | | | 2-Phenoxyethyl Acetate | | ○/○/○/○ | ○/○/○/○ | ○/○/○/○ | Δ/○/○/○ |

TABLE 5

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 2-1 | 2 | c | 2-Phenoxyethyl Isobutyrate | — | ○ | ○ | ○ | ○ |
| Example 2-2 | | | 4-(2-Acetoxyethoxy)toluene | | ○ | ○ | ○ | ○ |
| Example 2-3 | | | 2-Ethoxyethyl Benzoate | | ○ | ○ | ○ | ○ |
| Example 2-4 | | | 2-Isopropoxyethyl Benzoate | | ○ | ○ | ○ | ○ |
| Example 2-5 | | | 2-(Benzyloxy)ethanol | | ○ | ○ | ○ | Δ |
| Example 2-6 | | | 2-Phenoxyethanol | | ○ | Δ | ○ | Δ |
| Example 2-7 | | | 2-Phenoxyethyl Acetate | | ○ | Δ | ○ | Δ |
| Example 2-8 | 2 | D | 2-Phenoxyethyl Isobutyrate | Diethylene Glycol Butyl Methyl Ether | ○/○/○/○ | ○/○/○/○ | ○/○/○/○ | ○/○/○/○ |
| Example 2-9 | | | 4-(2-Acetoxyethoxy)toluene | | ○/○/○/○ | ○/○/○/○ | ○/○/○/○ | ○/○/○/○ |
| Example 2-10 | | | 2-Ethoxyethyl Benzoate | | ○/○/○/○ | ○/○/○/○ | ○/○/○/○ | ○/○/○/○ |
| Example 2-11 | | | 2-Isopropoxyethyl Benzoate | | ○/○/○/○ | ○/○/○/○ | ○/○/○/○ | ○/○/○/○ |
| Example 2-12 | | | 2-(Benzyloxy)ethanol | | ○/○/○/○ | ○/○/○/○ | ○/○/○/○ | Δ/○/○/○ |
| Example 2-13 | | | 2-Phenoxyethanol | | ○/○/○/○ | Δ/Δ/Δ/Δ | ○/○/○/○ | Δ/○/○/○ |
| Example 2-14 | | | 2-Phenoxyethyl Acetate | | ○/○/○/○ | Δ/Δ/Δ/Δ | ○/○/○/○ | Δ/○/○/○ |
| Example 2-15 | 2 | E | 2-Phenoxyethyl Isobutyrate | Diethylene Glycol Dibutyl Ether | ○/○/○/○ | ○/○/○/○ | ○/○/○/○ | ○/○/○/○ |
| Example 2-16 | | | 4-(2-Acetoxyethoxy)toluene | | ○/○/○/○ | ○/○/○/○ | ○/○/○/○ | ○/○/○/○ |
| Example 2-17 | | | 2-Ethoxyethyl Benzoate | | ○/○/○/○ | ○/○/○/○ | ○/○/○/○ | ○/○/○/○ |

TABLE 5-continued

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 2-18 | | | 2-Isopropoxyethyl Benzoate | | o/o/o/o | o/o/o/o | o/o/o/o | o/o/o/o |
| Example 2-19 | | | 2-(Benzyloxy)ethanol | | o/o/o/o | Δ/o/o/o | o/o/o/o | Δ/o/o/o |
| Example 2-20 | | | 2-Phenoxyethanol | | o/o/o/o | Δ/o/o/o | o/o/o/o | Δ/o/o/o |
| Example 2-21 | | | 2-Phenoxyethyl Acetate | | o/o/o/o | o/o/o/o | o/o/o/o | Δ/o/o/o |
| Example 2-22 | 2 | E | 2-Phenoxyethyl Isobutyrate | Isoamyl n-Octanoate | o/o/o/o | o/o/o/o | o/o/o/o | o/o/o/o |
| Example 2-23 | | | 4-(2-Acetoxyethoxy)toluene | | o/o/o/o | o/o/o/o | o/o/o/o | o/o/o/o |
| Example 2-24 | | | 2-Ethoxyethyl Benzoate | | o/o/o/o | o/o/o/o | o/o/o/o | o/o/o/o |
| Example 2-25 | | | 2-Isopropoxyethyl Benzoate | | o/o/o/o | o/o/o/o | o/o/o/o | o/o/o/o |
| Example 2-26 | | | 2-(Benzyloxy)ethanol | | o/o/o/o | o/o/o/o | o/o/o/o | Δ/o/o/o |
| Example 2-27 | | | 2-Phenoxyethanol | | o/o/o/o | Δ/o/o/o | o/o/o/o | Δ/o/o/o |
| Example 2-28 | | | 2-Phenoxyethyl Acetate | | o/o/o/o | Δ/o/o/o | o/o/o/o | Δ/o/o/o |

TABLE 6

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 3-1 | 3 | C | 2-Phenoxyethyl Isobutyrate | — | o | o | o | o |
| Example 3-2 | | | 4-(2-Acetoxyethoxy)toluene | | o | o | o | o |
| Example 3-3 | | | 2-Ethoxyethyl Benzoate | | o | o | o | o |
| Example 3-4 | | | 2-Isopropoxyethyl Benzoate | | o | o | o | o |
| Example 3-5 | | | 2-(Benzyloxy)ethanol | | o | o | o | Δ |
| Example 3-6 | | | 2-Phenoxyethanol | | o | Δ | o | Δ |
| Example 3-7 | | | 2-Phenoxyethyl Acetate | | o | Δ | o | Δ |
| Example 3-8 | 3 | C | 2-Phenoxyethyl Isobutyrate | Diethylene Glycol Butyl Methyl Ether | o/o/o/o | o/o/o/o | o/o/o/o | o/o/o/o |
| Example 3-9 | | | 4-(2-Acetoxyethoxy)toluene | | o/o/o/o | o/o/o/o | o/o/o/o | o/o/o/o |
| Example 3-10 | | | 2-Ethoxyethyl Benzoate | | o/o/o/o | o/o/o/o | o/o/o/o | o/o/o/o |
| Example 3-11 | | | 2-Isopropoxyethyl Benzoate | | o/o/o/o | o/o/o/o | o/o/o/o | o/o/o/o |
| Example 3-12 | | | 2-(Benzyloxy)ethanol | | o/o/o/o | o/o/o/o | o/o/o/o | Δ/o/o/o |
| Example 3-13 | | | 2-Phenoxyethanol | | o/o/o/o | Δ/Δ/Δ/Δ | o/o/o/o | Δ/o/o/o |
| Example 3-14 | | | 2-Phenoxyethyl Acetate | | o/o/o/o | Δ/Δ/Δ/Δ | o/o/o/o | Δ/o/o/o |
| Example 3-15 | 3 | E | 2-Phenoxyethyl Isobutyrate | Diethylene Glycol Dibutyl Ether | o/o/o/o | o/o/o/o | o/o/o/o | o/o/o/o |
| Example 3-16 | | | 4-(2-Acetoxyethoxy)toluene | | o/o/o/o | o/o/o/o | o/o/o/o | o/o/o/o |

TABLE 6-continued

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 3-17 | | | 2-Ethoxyethyl Benzoate | | o/o/o/o | o/o/o/o | o/o/o/o | o/o/o/o |
| Example 3-18 | | | 2-Isopropoxyethyl Benzoate | | o/o/o/o | o/o/o/o | o/o/o/o | o/o/o/o |
| Example 3-19 | | | 2-(Benzyloxy)ethanol | | o/o/o/o | Δ/o/o/o | o/o/o/o | Δ/o/o/o |
| Example 3-20 | | | 2-Phenoxyethanol | | o/o/o/o | Δ/o/o/o | o/o/o/o | Δ/o/o/o |
| Example 3-21 | | | 2-Phenoxyethyl Acetate | | o/o/o/o | o/o/o/o | o/o/o/o | Δ/o/o/o |
| Example 3-22 | 3 | E | 2-Phenoxyethyl Isobutyrate | Isoamyl n-Octanoate | o/o/o/o | o/o/o/o | o/o/o/o | o/o/o/o |
| Example 3-23 | | | 4-(2-Acetoxyethoxy)toluene | | o/o/o/o | o/o/o/o | o/o/o/o | o/o/o/o |
| Example 3-24 | | | 2-Ethoxyethyl Benzoate | | o/o/o/o | o/o/o/o | o/o/o/o | o/o/o/o |
| Example 3-25 | | | 2-Isopropoxyethyl Benzoate | | o/o/o/o | o/o/o/o | o/o/o/o | o/o/o/o |
| Example 3-26 | | | 2-(Benzyloxy)ethanol | | o/o/o/o | o/o/o/o | o/o/o/o | Δ/o/o/o |
| Example 3-27 | | | 2-Phenoxyethanol | | o/o/o/o | Δ/o/o/o | o/o/o/o | Δ/o/o/o |
| Exampl 3-28 | | | 2-Phenoxyethyl Acetate | | o/o/o/o | Δ/o/o/o | o/o/o/o | Δ/o/o/o |

TABLE 7

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 4-1 | 4 | C | 2-Phenoxyethyl Isobutyrate | — | o | o | o | o |
| Example 4-2 | | | 4-(2-Acetoxyethoxy)toluene | | o | o | o | o |
| Example 4-3 | | | 2-Ethoxyethyl Benzoate | | o | o | o | o |
| Example 4-4 | | | 2-Isopropoxyethyl Benzoate | | o | o | o | o |
| Example 4-5 | | | 2-(Benzyloxy)ethanol | | o | o | o | Δ |
| Example 4-6 | | | 2-Phenoxyethanol | | o | Δ | o | Δ |
| Example 4-7 | | | 2-Phenoxyethyl Acetate | | o | Δ | o | Δ |
| Example 4-8 | 4 | C | 2-Phenoxyethyl Isobutyrate | Diethylene Glycol | o/o/o/o | o/o/o/o | o/o/o/o | o/o/o/o |
| Example 4-9 | | | 4-(2-Acetoxyethoxy)toluene | Butyl Methyl Ether | o/o/o/o | o/o/o/o | o/o/o/o | o/o/o/o |
| Example 4-10 | | | 2-Ethoxyethyl Benzoate | | o/o/o/o | o/o/o/o | o/o/o/o | o/o/o/o |
| Example 4-11 | | | 2-Isopropoxyethyl Benzoate | | o/o/o/o | o/o/o/o | o/o/o/o | o/o/o/o |
| Example 4-12 | | | 2-(Benzyloxy)ethanol | | o/o/o/o | o/o/o/o | o/o/o/o | Δ/o/o/o |
| Example 4-13 | | | 2-Phenoxyethanol | | o/o/o/o | o/o/o/o | o/o/o/o | Δ/o/o/o |
| Example 4-14 | | | 2-Phenoxyethyl Acetate | | o/o/o/o | o/o/o/o | o/o/o/o | Δ/o/o/o |
| Example 4-15 | 4 | E | 2-Phenoxyethyl Isobutyrate | Diethylene Glycol | o/o/o/o | o/o/o/o | o/o/o/o | o/o/o/o |

TABLE 7-continued

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 4-16 | | | 4-(2-Acetoxyethoxy)toluene | Dibutyl Ether | o/o/o/o | o/o/o/o | o/o/o/o | o/o/o/o |
| Example 4-17 | | | 2-Ethoxyethyl Benzoate | | o/o/o/o | o/o/o/o | o/o/o/o | o/o/o/o |
| Example 4-18 | | | 2-Isopropoxyethyl Benzoate | | o/o/o/o | o/o/o/o | o/o/o/o | o/o/o/o |
| Example 4-19 | | | 2-(Benzyloxy)ethanol | | o/o/o/o | Δ/o/o/o | o/o/o/o | Δ/o/o/o |
| Example 4-20 | | | 2-Phenoxyethanol | | o/o/o/o | Δ/o/o/o | o/o/o/o | Δ/o/o/o |
| Example 4-21 | | | 2-Phenoxyethyl Acetate | | o/o/o/o | o/o/o/o | o/o/o/o | Δ/o/o/o |
| Example 4-22 | 4 | E | 2-Phenoxyethyl Isobutyrate | Isoamyl n-Octanoate | o/o/o/o | o/o/o/o | o/o/o/o | o/o/o/o |
| Example 4-23 | | | 4-(2-Acetoxyethoxy)toluene | | o/o/o/o | o/o/o/o | o/o/o/o | o/o/o/o |
| Example 4-24 | | | 2-Ethoxyethyl Benzoate | | o/o/o/o | o/o/o/o | o/o/o/o | o/o/o/o |
| Example 4-25 | | | 2-Isopropoxyethyl Benzoate | | o/o/o/o | o/o/o/o | o/o/o/o | o/o/o/o |
| Example 4-26 | | | 2-(Benzyloxy)ethanol | | o/o/o/o | o/o/o/o | o/o/o/o | Δ/o/o/o |
| Example 4-27 | | | 2-Phenoxyethanol | | o/o/o/o | o/o/o/o | o/o/o/o | Δ/o/o/o |
| Example 4-28 | | | 2-Phenoxyethyl Acetate | | o/o/o/o | o/o/o/o | o/o/o/o | Δ/o/o/o |

TABLE 8

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 5-1 | 5 | C | 2-Phenoxyethyl Isobutyrate | — | o | o | o | o |
| Example 5-2 | | | 4-(2-Acetoxyethoxy)toluene | | o | o | o | o |
| Example 5-3 | | | 2-Ethoxyethyl Benzoate | | o | o | o | o |
| Example 5-4 | | | 2-Isopropoxyethyl Benzoate | | o | o | o | o |
| Example 5-5 | | | 2-(Benzyloxy)ethanol | | o | o | o | Δ |
| Example 5-6 | | | 2-Phenoxyethanol | | o | Δ | o | Δ |
| Example 5-7 | | | 2-Phenoxyethyl Acetate | | o | Δ | o | Δ |
| Example 5-8 | 5 | C | 2-Phenoxyethyl Isobutyrate | Diethylene Glycol Butyl Methyl Ether | o/o/o/o | o/o/o/o | o/o/o/o | o/o/o/o |
| Example 5-9 | | | 4-(2-Acetoxyethoxy)toluene | | o/o/o/o | o/o/o/o | o/o/o/o | o/o/o/o |
| Example 5-10 | | | 2-Ethoxyethyl Benzoate | | o/o/o/o | o/o/o/o | o/o/o/o | o/o/o/o |
| Example 5-11 | | | 2-Isopropoxyethyl Benzoate | | o/o/o/o | o/o/o/o | o/o/o/o | o/o/o/o |
| Example 5-12 | | | 2-(Benzyloxy)ethanol | | o/o/o/o | o/o/o/o | o/o/o/o | Δ/o/o/o |
| Example 5-13 | | | 2-Phenoxyethanol | | o/o/o/o | o/o/o/o | o/o/o/o | Δ/o/o/o |
| Example 5-14 | | | 2-Phenoxyethyl Acetate | | o/o/o/o | o/o/o/o | o/o/o/o | Δ/o/o/o |

TABLE 8-continued

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 5-15 | 5 | E | 2-Phenoxyethyl Isobutyrate | Diethylene Glycol | o/o/o/o | o/o/o/o | o/o/o/o | o/o/o/o |
| Example 5-16 | | | 4-(2-Acetoxyethoxy)toluene | Dibutyl Ether | o/o/o/o | o/o/o/o | o/o/o/o | o/o/o/o |
| Example 5-17 | | | 2-Ethoxyethyl Benzoate | | o/o/o/o | o/o/o/o | o/o/o/o | o/o/o/o |
| Example 5-18 | | | 2-Isopropoxyethyl Benzoate | | o/o/o/o | o/o/o/o | o/o/o/o | o/o/o/o |
| Example 5-19 | | | 2-(Benzyloxy)ethanol | | o/o/o/o | Δ/o/o/o | o/o/o/o | Δ/o/o/o |
| Example 5-20 | | | 2-Phenoxyethanol | | o/o/o/o | Δ/o/o/o | o/o/o/o | Δ/o/o/o |
| Example 5-21 | | | 2-Phenoxyethyl Acetate | | o/o/o/o | o/o/o/o | o/o/o/o | Δ/o/o/o |
| Example 5-22 | 5 | E | 2-Phenoxyethyl Isobutyrate | Isoamyl n-Octanoate | o/o/o/o | o/o/o/o | o/o/o/o | o/o/o/o |
| Example 5-23 | | | 4-(2-Acetoxyethoxy)toluene | | o/o/o/o | o/o/o/o | o/o/o/o | o/o/o/o |
| Example 5-24 | | | 2-Ethoxyethyl Benzoate | | o/o/o/o | o/o/o/o | o/o/o/o | o/o/o/o |
| Example 5-25 | | | 2-Isopropoxyethyl Benzoate | | o/o/o/o | o/o/o/o | o/o/o/o | o/o/o/o |
| Example 5-26 | | | 2-(Benzyloxy)ethanol | | o/o/o/o | o/o/o/o | o/o/o/o | Δ/o/o/o |
| Example 5-27 | | | 2-Phenoxyethanol | | o/o/o/o | o/o/o/o | o/o/o/o | Δ/o/o/o |
| Example 5-28 | | | 2-Phenoxyethyl Acetate | | o/o/o/o | o/o/o/o | o/o/o/o | Δ/o/o/o |

TABLE 9

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 6-1 | 6 | c | 2-Phenoxyethyl Isobutyrate | — | o | o | o | o |
| Example 6-2 | | | 4-(2-Acetoxyethoxy)toluene | | o | o | o | o |
| Example 6-3 | | | 2-Ethoxyethyl Benzoate | | o | o | o | o |
| Example 6-4 | | | 2-Isopropoxyethyl Benzoate | | o | o | o | o |
| Example 6-5 | | | 2-(Benzyloxy)ethanol | | o | o | o | Δ |
| Example 6-6 | | | 2-Phenoxyethanol | | o | Δ | o | Δ |
| Example 6-7 | | | 2-Phenoxyethyl Acetate | | o | Δ | o | Δ |
| Example 6-8 | 6 | D | 2-Phenoxyethyl Isobutyrate | Diethylene Glycol | o/o/o/o | o/o/o/o | o/o/o/o | o/o/o/o |
| Example 6-9 | | | 4-(2-Acetoxyethoxy)toluene | Butyl Methyl Ether | o/o/o/o | o/o/o/o | o/o/o/o | o/o/o/o |
| Example 6-10 | | | 2-Ethoxyethyl Benzoate | | o/o/o/o | o/o/o/o | o/o/o/o | o/o/o/o |

TABLE 9-continued

| | Functional Layer Material (2 wt %, 8:2) | | | | Evaluation of Ink Stability | Evaluation of Discharge Stability | Evaluation of Ink Film Image | Evaluation of Ink Film Flatness |
|---|---|---|---|---|---|---|---|---|
| | Compound | P-Doping Material | First Solvent | Second Solvent | Ratio of First Solvent:Second Solvent (Mass) = 8:2/7:3/6:4/5:5 | | | |
| Example 6-11 | | | 2-Isopropoxyethyl Benzoate | | o/o/o/o | o/o/o/o | o/o/o/o | o/o/o/o |
| Example 6-12 | | | 2-(Benzyloxy)ethanol | | o/o/o/o | o/o/o/o | o/o/o/o | Δ/o/o/o |
| Example 6-13 | | | 2-Phenoxyethanol | | o/o/o/o | Δ/Δ/Δ/Δ | o/o/o/o | Δ/o/o/o |
| Example 6-14 | | | 2-Phenoxyethyl Acetate | | o/o/o/o | Δ/Δ/Δ/Δ | o/o/o/o | Δ/o/o/o |
| Example 6-15 | 6 | E | 2-Phenoxyethyl Isobutyrate | Diethylene Glycol | o/o/o/o | o/o/o/o | o/o/o/o | o/o/o/o |
| Example 6-16 | | | 4-(2-Acetoxyethoxy)toluene | Dibutyl Ether | o/o/o/o | o/o/o/o | o/o/o/o | o/o/o/o |
| Example 6-17 | | | 2-Ethoxyethyl Benzoate | | o/o/o/o | o/o/o/o | o/o/o/o | o/o/o/o |
| Example 6-18 | | | 2-Isopropoxyethyl Benzoate | | o/o/o/o | o/o/o/o | o/o/o/o | o/o/o/o |
| Example 6-19 | | | 2-(Benzyloxy)ethanol | | o/o/o/o | Δ/o/o/o | o/o/o/o | Δ/o/o/o |
| Example 6-20 | | | 2-Phenoxyethanol | | o/o/o/o | Δ/o/o/o | o/o/o/o | Δ/o/o/o |
| Example 6-21 | | | 2-Phenoxyethyl Acetate | | o/o/o/o | o/o/o/o | o/o/o/o | Δ/o/o/o |
| Example 6-22 | 6 | E | 2-Phenoxyethyl Isobutyrate | Isoamyl n-Octanoate | o/o/o/o | o/o/o/o | o/o/o/o | o/o/o/o |
| Example 6-23 | | | 4-(2-Acetoxyethoxy)toluene | | o/o/o/o | o/o/o/o | o/o/o/o | o/o/o/o |
| Example 6-24 | | | 2-Ethoxyethyl Benzoate | | o/o/o/o | o/o/o/o | o/o/o/o | o/o/o/o |
| Example 6-25 | | | 2-Isopropoxyethyl Benzoate | | o/o/o/o | o/o/o/o | o/o/o/o | o/o/o/o |
| Example 6-26 | | | 2-(Benzyloxy)ethanol | | o/o/o/o | o/o/o/o | o/o/o/o | Δ/o/o/o |
| Example 6-27 | | | 2-Phenoxyethanol | | o/o/o/o | Δ/o/o/o | o/o/o/o | Δ/o/o/o |
| Example 6-28 | | | 2-Phenoxyethyl Acetate | | o/o/o/o | Δ/o/o/o | o/o/o/o | Δ/o/o/o |

As seen from Tables 4 to 9, ink properties (stability, discharge property, film image, film flatness) depending on the types of the functional layer material compounds were almost the same in the experimental results.

In all the examples of Tables 4 to 9, ink stability was O in the evaluation, and a clear film image was obtained without precipitation when drying the ink film. This is considered to be due to chemical properties caused from a specific structure of the solvent. It is considered to be due to the fact that the solvent is capable of stably interacting with the functional materials due to its chemical properties having a glycol functional group and a benzene structure, and an effect of dissolving/dispersing the materials is superior even under a condition of high material concentration.

In the examples of Tables 4 to 9, discharge stability and film flatness were Δ in the evaluation in the ink having 2-phenoxyethanol or 2-phenoxyethyl acetate added alone. This is considered to be due to a somewhat low boiling point of the solvent.

A solvent having a low boiling point generally has a property of high vapor pressure, and favorably volatilizes in an inkjet process decreasing processability. In addition, the ink shape is more likely to form a U-shape since the ink solidifies relatively quickly in the drying process. An aliphatic solvent (second solvent) having a property of high flatness was added in 20% to 50% in order to improve this, and it was identified that film flatness was improved from Δ to O from the condition of adding 30% or more.

In the examples of Tables 4 to 9, film flatness was A in the evaluation in the ink having 2-(benzyloxy)ethanol added alone, and this is considered to be due to a chemical structure with the solvent having an —OH functional group. Polarity increases when having an —OH functional group, and solvents having relatively high hydrophilicity are favorably wetted on a bank wall when drying forming a U-shape in a solidification process. An aliphatic solvent (second solvent) having a property of high flatness was added in 20% to 50% in order to improve this, and it was identified that film flatness was improved from Δ to O from the condition of adding 30% or more.

The invention claimed is:

1. An ink composition comprising:
   a first solvent represented by Chemical Formula 1-1 or Chemical Formula 1-2;
   a second solvent selected from diethylene glycol butyl methyl ether, diethylene glycol dibutyl ether, tetraethylene glycol dimethyl ether, triethylene glycol butyl methyl ether, ethyl n-octanoate, isopropyl n-octanoate, isoamyl n-octanoate, amyl n-octanoate, methyl laurate, or a combination thereof; and a compound represented by Chemical Formula 2:

[Chemical Formula 1-1]

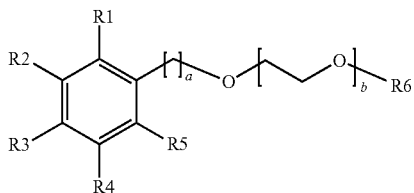

[Chemical Formula 1-2]

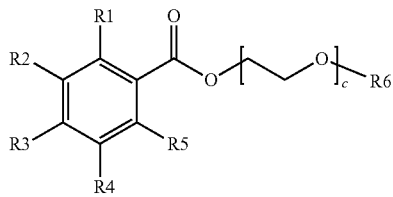

[Chemical Formula 2]

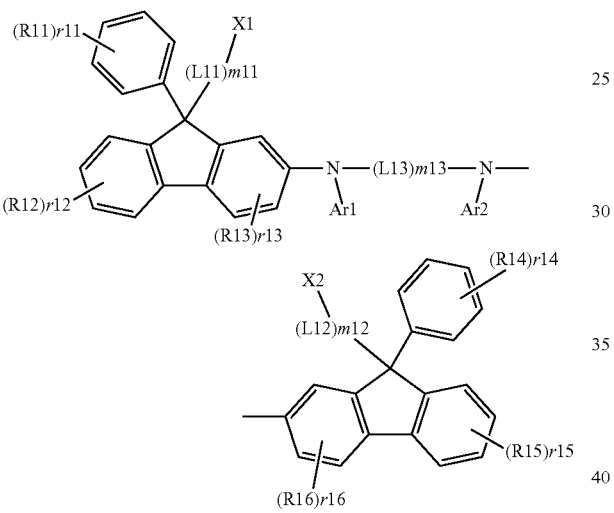

wherein, in Chemical Formula 1-1, Chemical Formula 1-2 and Chemical Formula 2,

Ar1 and Ar2 are the same as or different from each other, and each independently hydrogen, or a substituted or unsubstituted aryl group;

R6 is hydrogen, a hydroxyl group, a substituted or unsubstituted alkyl group, or —COR;

R and R1 to R5 are the same as or different from each other, and each independently hydrogen, a hydroxyl group, a substituted or unsubstituted alkoxy group, a substituted or unsubstituted alkyl group, a substituted or unsubstituted ester group, a substituted or unsubstituted carbonyl group, a substituted or unsubstituted aryl group, a substituted or unsubstituted heteroaryl group, a substituted or unsubstituted silyl group, or a substituted or unsubstituted phosphine oxide group;

R11 to R16 are the same as or different from each other, and each independently hydrogen, deuterium, a nitrile group, a hydroxyl group, a halogen group, a substituted or unsubstituted alkyl group, a substituted or unsubstituted aryl group, or a substituted or unsubstituted alkenyl group;

X1 and X2 are the same as or different from each other, and each independently a substituted or unsubstituted aryl group;

L11 to L13 are the same as or different from each other, and each independently a direct bond, —O—, a substituted or unsubstituted an alkylene group, or a substituted or unsubstituted arylene group;

a is an integer of 0 to 10;

b and c are each independently an integer of 1 to 10, provided when R1 to R6 are each hydrogen, then a is an integer of 1 to 10, and b is an integer of 2 to 10;

m11 to m13 are the same as or different from each other, and each independently an integer of 1 to 10;

r11 and r14 are the same as or different from each other, and each independently an integer of 0 to 5;

r12 and r15 are the same as or different from each other, and each independently an integer of 0 to 4;

r13 and r16 are the same as or different from each other, and each independently an integer of 0 to 3; and when m11 to m13, and r11 to r16 are a plural number, L11 to L13 and R11 to R16 are each the same as or different from each other, wherein -(L11)m11-X1 and -(L12)m12-X2 are the same as or different from each other, and are each independently one selected from among the following substituents:

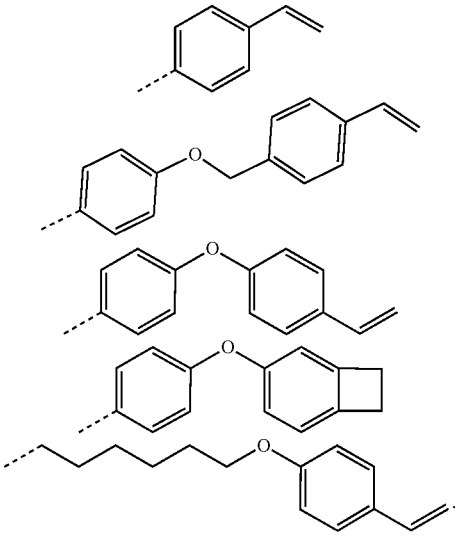

2. The ink composition of claim 1, wherein the second solvent is included in 10% by mass to 90% by mass with respect to the whole ink composition.

3. The ink composition of claim 1, further comprising a doping material selected from Chemical Formulas A to F:

Chemical Formula A

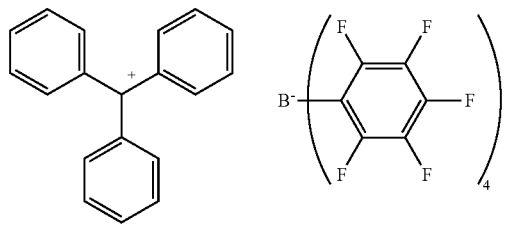

-continued

Chemical Formula C

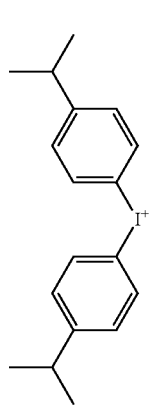
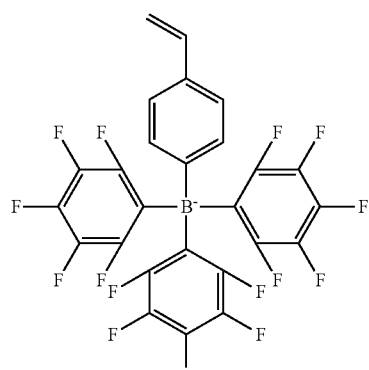

Chemical Formula D

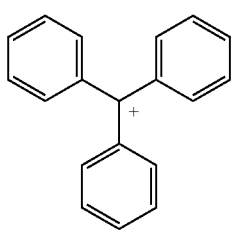
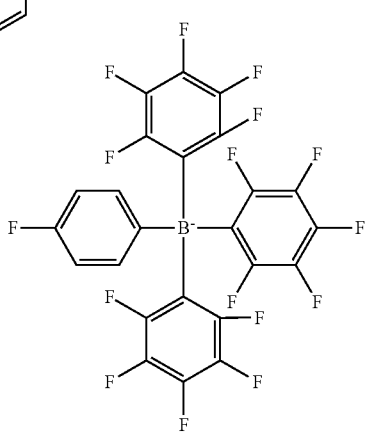

Chemical Formula E

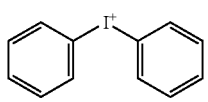

-continued

Chemical Formula F

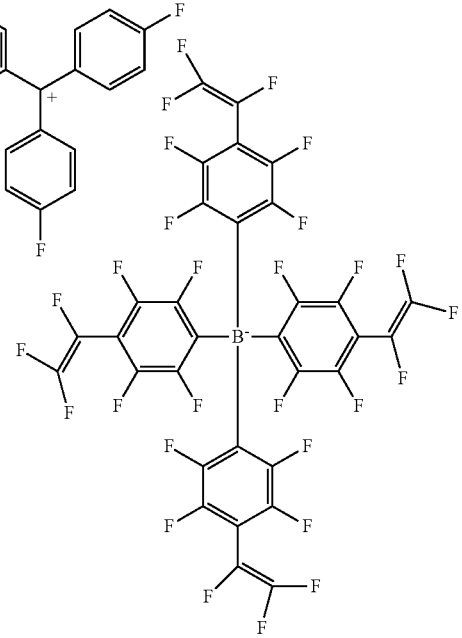

Chemical Formula B

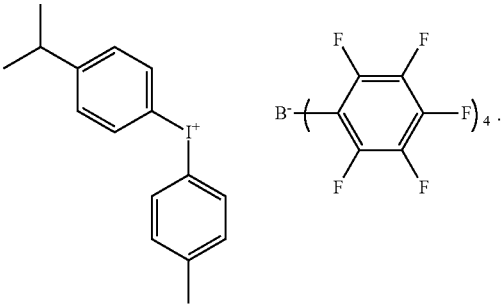

4. The ink composition of claim 1, wherein the first solvent is 3-(2-hydroxyethoxy)toluene, 4-(2-hydroxyethoxy)toluene, methyl 4-(2-hydroxyethoxy)benzoate, 2-phenoxyethyl acetate, 4-(2-acetoxyethoxy)toluene, 2-phenoxyethyl isobutyrate, 2-ethoxyethyl benzoate, 2-isopropoxyethyl benzoate, or a combination thereof.

5. The ink composition of claim 1, wherein the compound represented by Chemical Formula 2 is one selected from the following structures:

Compound 1
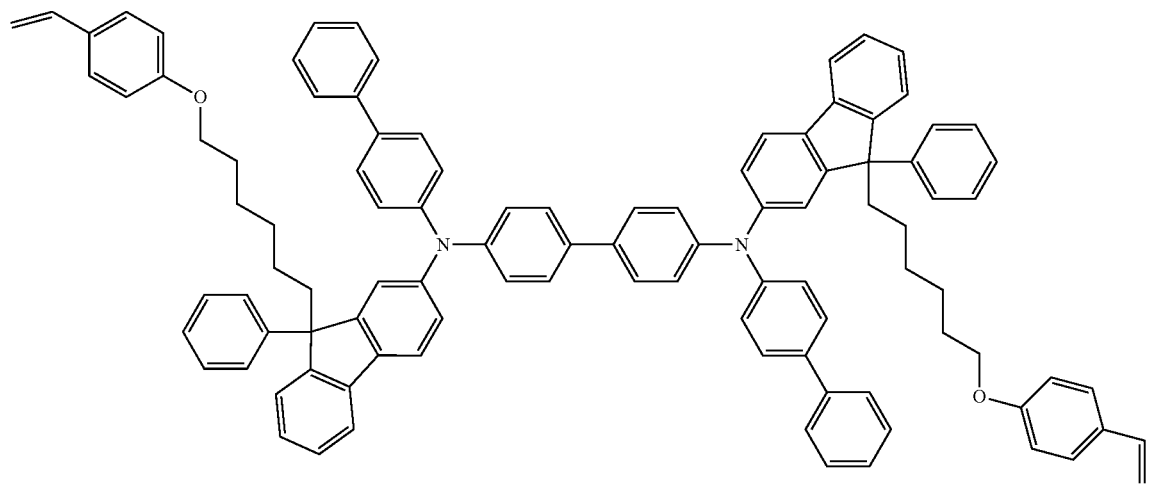
Compound 3
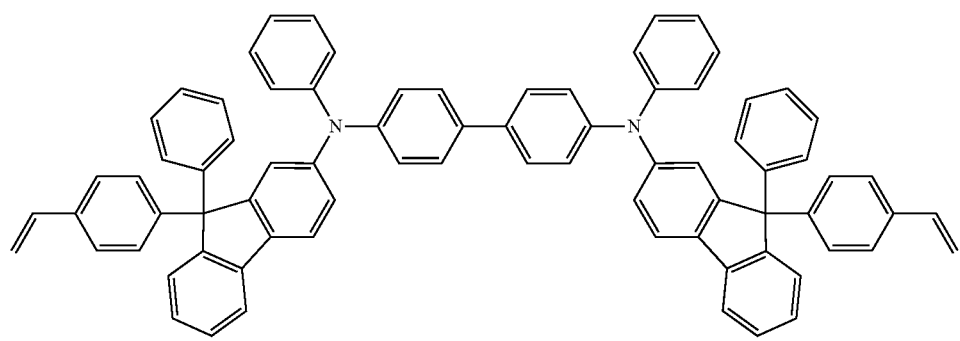
Compound 4
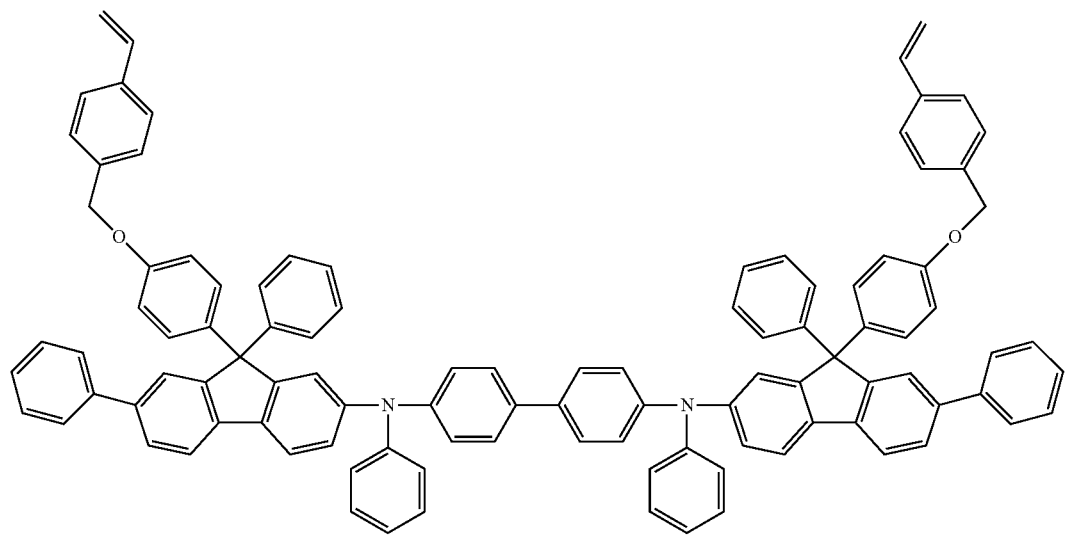

-continued

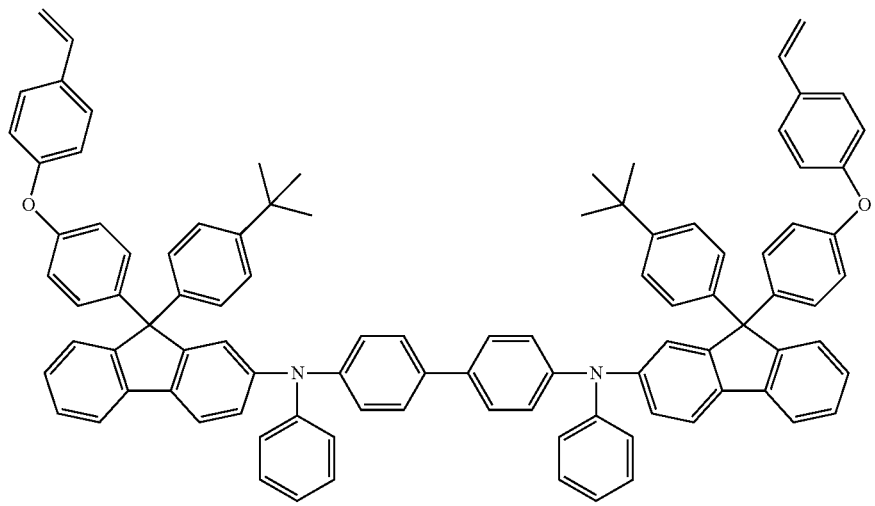

Compound 5

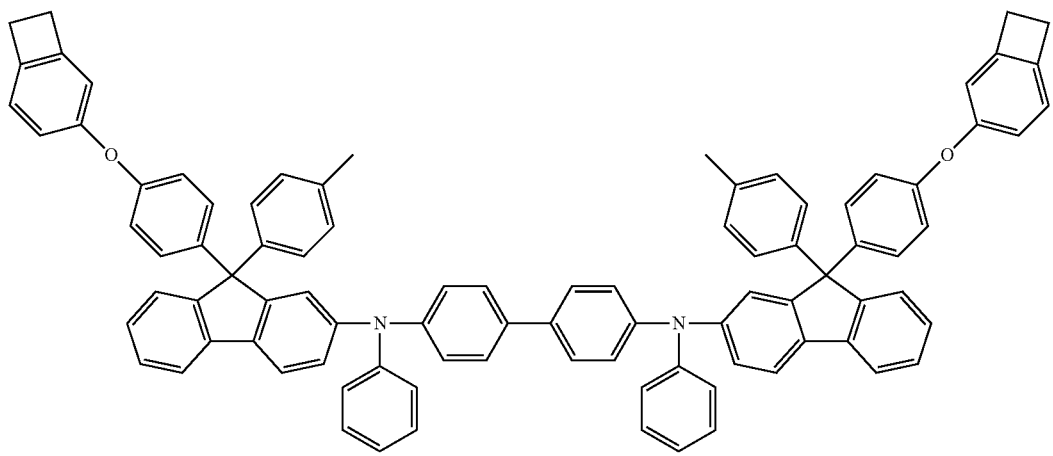

Compound 6

6. An organic light emitting device comprising:
a first electrode;
a second electrode; and
one or more organic material layers provided between the first electrode and the second electrode,
wherein the one or more organic material layers include the ink composition of claim 1 or a cured material thereof; and
the cured material of the ink composition is in a cured state by heat treating or light treating the ink composition.

7. A method for manufacturing an organic light emitting device, the method comprising:
preparing a substrate;
forming a first electrode on the substrate;
forming one or more organic material layers on the first electrode; and
forming a second electrode on the one or more organic material layers,
wherein the forming of the one or more organic material layers is performed using the ink composition of claim 1 or a cured material thereof.

8. The organic light emitting device of claim 6, wherein the one or more organic material layers include a light emitting layer, and the light emitting layer includes the ink composition or a cured material thereof.

9. The method for manufacturing an organic light emitting device of claim 7, wherein the forming of the one or more organic material layers using the ink composition is performed by using an inkjet printing method.

* * * * *